United States Patent
Noda

(10) Patent No.: US 9,831,261 B2
(45) Date of Patent: Nov. 28, 2017

(54) SEMICONDUCTOR MEMORY DEVICE WITH FIRST AND SECOND SEMICONDUCTOR FILMS IN FIRST AND SECOND COLUMNAR BODIES

(71) Applicant: Toshiba Memory Corporation, Minato-ku (JP)

(72) Inventor: Kotaro Noda, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/731,825

(22) Filed: Jun. 5, 2015

(65) Prior Publication Data
US 2016/0276361 A1 Sep. 22, 2016

Related U.S. Application Data

(60) Provisional application No. 62/134,648, filed on Mar. 18, 2015.

(51) Int. Cl.
*H01L 27/11582* (2017.01)
*H01L 27/11565* (2017.01)
*H01L 29/792* (2006.01)
*H01L 27/11575* (2017.01)

(52) U.S. Cl.
CPC .. *H01L 27/11582* (2013.01); *H01L 27/11565* (2013.01); *H01L 27/11575* (2013.01); *H01L 29/7926* (2013.01)

(58) Field of Classification Search
CPC ........... H01L 27/11524; H01L 27/1157; H01L 2224/73265; H01L 2224/48227; H01L 23/528

See application file for complete search history.

(56) References Cited

U.S. PATENT DOCUMENTS

| | | | |
|---|---|---|---|
| 7,936,004 B2 | 5/2011 | Kito et al. | |
| 2007/0252201 A1 | 11/2007 | Kito et al. | |
| 2010/0109065 A1* | 5/2010 | Oh | H01L 27/0688 257/314 |
| 2010/0327340 A1* | 12/2010 | Oota | H01L 27/11573 257/324 |
| 2016/0056168 A1* | 2/2016 | Lue | H01L 27/11582 365/185.18 |
| 2016/0064281 A1* | 3/2016 | Izumi | H01L 21/76816 257/315 |
| 2016/0217869 A1* | 7/2016 | Tseng | G11C 16/3459 |

* cited by examiner

*Primary Examiner* — Marcos D Pizarro
*Assistant Examiner* — Shannon Yi
(74) *Attorney, Agent, or Firm* — Oblon, McClelland, Maier & Neustadt, L.L.P.

(57) ABSTRACT

A semiconductor memory device according to an embodiment comprises: conductive layers stacked in a vertical direction on a semiconductor substrate; and first and columnar bodies that extend in the vertical direction, the first and second columnar bodies each comprising: a first film; a second film disposed on the first film; and a semiconductor film, and the first film of the second columnar body having an upper end positioned higher than a first position lower than a first conductive layer and lower than a second position higher than the first conductive layer and a lower end positioned at or lower than the first position, and the second film of the second columnar body having an upper end positioned higher than the second position and a lower end positioned lower than the first position.

17 Claims, 32 Drawing Sheets

SEMICONDUCTOR MEMORY DEVICE WITH FIRST AND SECOND SEMICONDUCTOR FILMS IN FIRST AND SECOND COLUMNAR BODIES

CROSS-REFERENCE TO RELATED APPLICATIONS

This application is based upon and claims the benefit of priority from the prior U.S. Provisional Application 62/134,648, filed on Mar. 18, 2015, the entire contents of which are incorporated herein by reference.

BACKGROUND

Field

An embodiment of the present invention relates to a semiconductor memory device.

Description of the Related Art

One kind of semiconductor memory device is a flash memory. Generally, a NAND type flash memory in particular is widely used since it is low cost and has a large capacity. Moreover, up to now, many technologies for further increasing the capacity of this NAND type flash memory have been proposed. One such technology is a structure in which memory cells are three-dimensionally disposed.

DETAILED DESCRIPTION

A semiconductor memory device according to an embodiment comprises: a plurality of conductive layers stacked in a vertical direction on a semiconductor substrate; and a first columnar body and a second columnar body that extend in the vertical direction and have a side surface facing a side surface of the plurality of conductive layers, the first columnar body and the second columnar body each comprising: a first film; a second film disposed on the first film; and a semiconductor film disposed between the plurality of conductive layers and the first film and between the plurality of conductive layers and the second film, and in the case that a certain position lower than a first conductive layer included in the plurality of conductive layers is assumed to be a first position and a certain position higher than the first conductive layer is assumed to be a second position, the first film of the second columnar body having an upper end positioned higher than the first position and lower than the second position and a lower end positioned at or lower than the first position, and the second film of the second columnar body having an upper end positioned higher than the second position and a lower end positioned lower than the first position.

A semiconductor memory device according to an embodiment will be described below with reference to the drawings.

[Configuration and Structure of Semiconductor Memory Device According to Embodiment]

First, an overall configuration of a semiconductor memory device according to an embodiment will be described.

Figure 1:
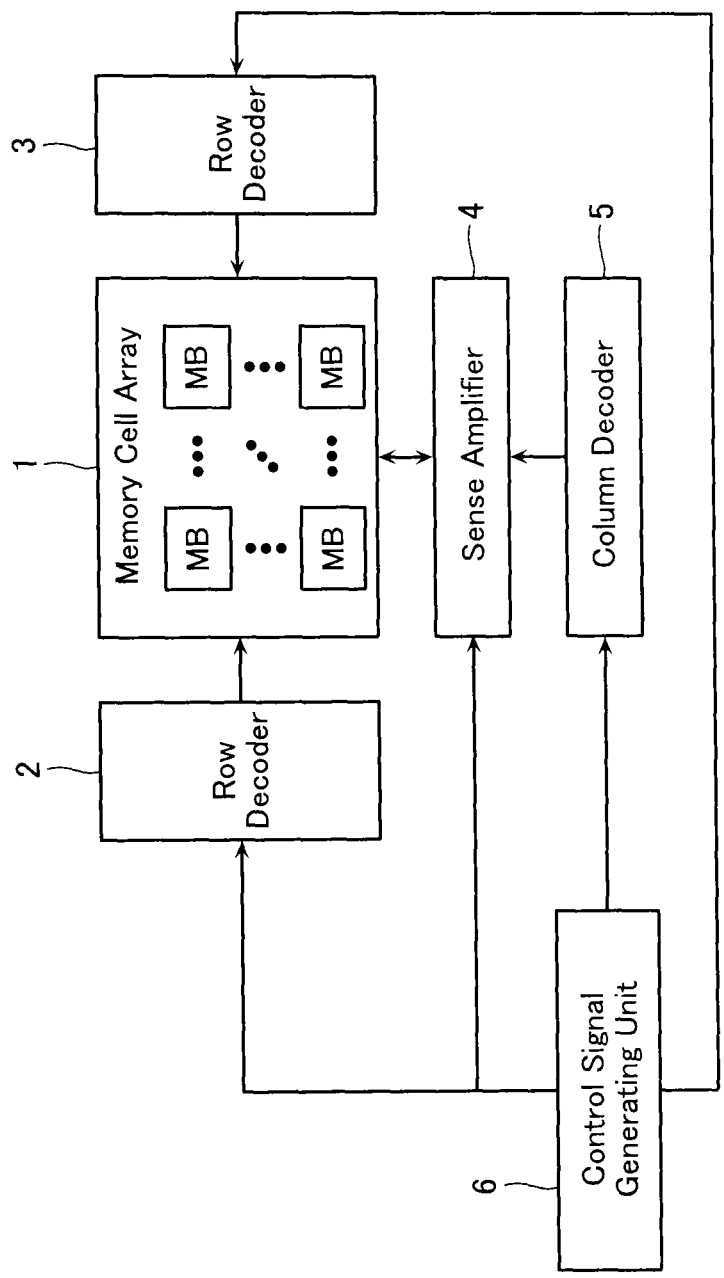
FIG. 1 is a view showing functional blocks of a semiconductor memory device according to an embodiment.

FIG. 1 is a view showing functional blocks of the semiconductor memory device according to the embodiment.

The semiconductor memory device according to the embodiment includes: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory transistors MT, being a plurality of memory cells MC, arranged three-dimensionally therein, and is a unit of an erase operation of data. Note that each of the memory blocks MB is divided by a plurality of trenches extending in one direction. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or the erase operation, generates a control signal and controls the row decoders 2 and 3, the sense amplifier 4, and the column decoder 5.

Next, an outline of a structure of the memory cell array 1 will be described.

Figure 2:
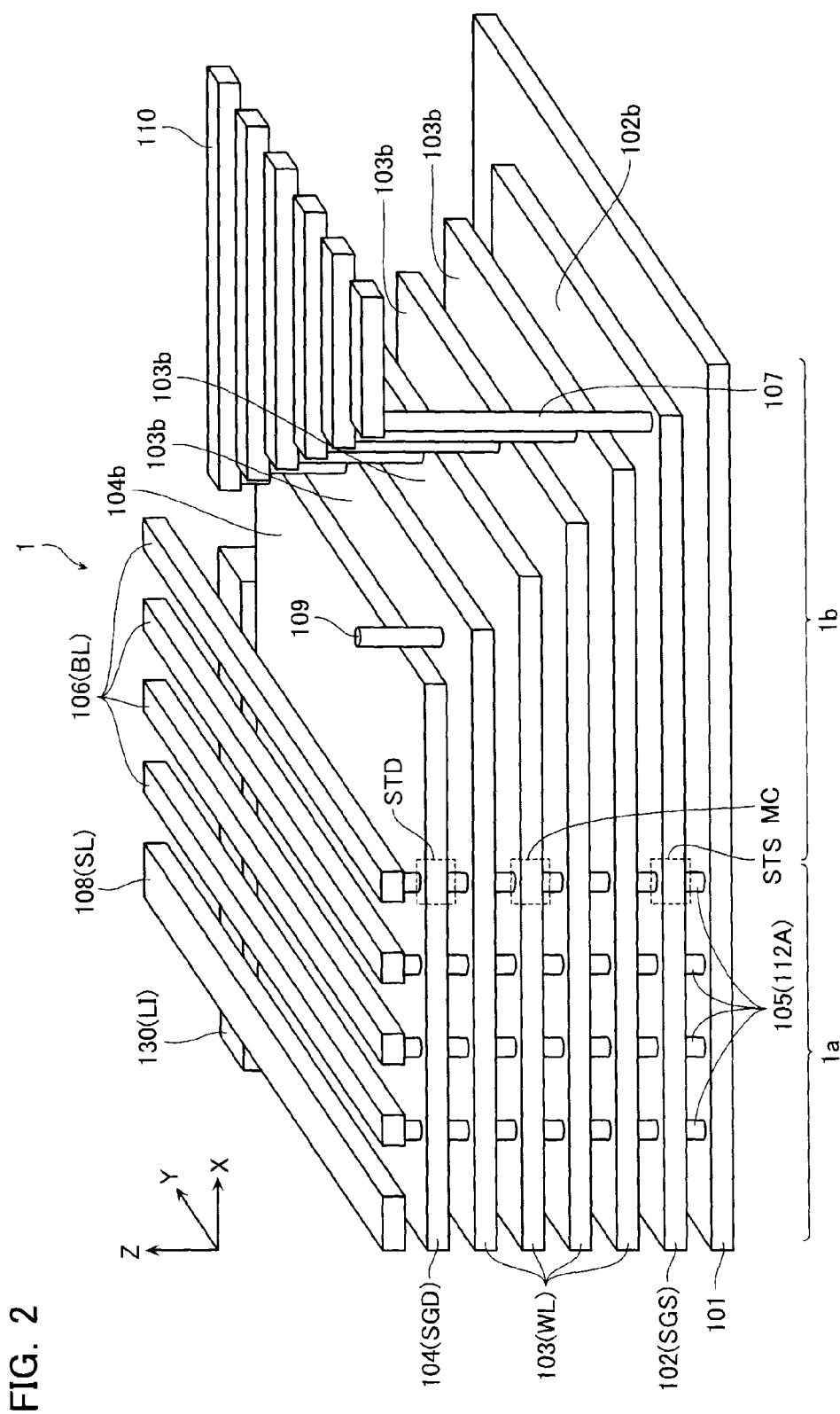
FIG. 2 is a perspective view showing a structure of a memory cell array in the semiconductor memory device according to the embodiment.

FIG. 2 is a perspective view showing the structure of the memory cell array in the semiconductor memory device according to the embodiment. Note that FIG. 2 is one example of the structure of the memory cell array 1, and numbers, and so on, of each of the configurations are not limited to those of this example.

As shown in FIG. 2, the memory cell array 1 includes: a semiconductor substrate 101; and a plurality of conductive layers 102 to 104 stacked in a Z direction (stacking direction) on the semiconductor substrate 101. The conductive layers 102 to 104 are formed from the likes of tungsten (W) or polysilicon (Poly-Si), for example. The conductive layer 102 functions as a source side select gate line SGS. The conductive layer 103 functions as a word line WL. The conductive layer 104 functions as a drain side select gate line SGD. Hereafter, the source side select gate line SGS and the drain side select gate line SGD will sometimes also be referred to simply as "select gate line".

Moreover, the memory cell array 1 includes a plurality of memory columnar bodies 105 extending in the Z direction. An intersection of the conductive layer 102 and the memory columnar body 105 functions as a source side select transistor STS. An intersection of the conductive layer 103 and the memory columnar body 105 functions as the memory cell MC. An intersection of the conductive layer 104 and the memory columnar body 105 functions as a drain side select transistor STD. Hereafter, the source side select transistor STS and the drain side select transistor STD will sometimes also be referred to simply as "select transistor".

The plurality of conductive layers 102 to 104 are formed in steps. That is, certain conductive layers 102 to 104 have contact portions 102b to 104b that do not face a lower surface of other conductive layers 102 to 104 positioned in a layer above. Moreover, the conductive layers 102 to 104 are connected to a via 107 at these contact portions 102b to 104b. A wiring line 110 is disposed on an upper end of the via 107. Note that the via 107 and the wiring line 110 are formed from the likes of tungsten (W), for example.

In addition, the memory cell array 1 includes a conductive layer 130 that faces side surfaces in a Y direction of the plurality of conductive layers 102 to 104 and extends in an X direction. A lower surface of the conductive layer 130 contacts the semiconductor substrate 101. The conductive layer 130 is formed from the likes of tungsten (W), for example, and functions as a source contact LI.

Moreover, the memory cell array 1 includes a plurality of conductive lines 106 and a conductive line 108 that are positioned above the plurality of conductive layers 102 to 104 and the memory columnar body 105, are aligned in plurality in the X direction, and extend in the Y direction. The memory columnar bodies 105 are respectively electrically connected to lower surfaces of the conductive lines 106. Note that the conductive line 106 is formed from the likes of tungsten (W), for example, and functions as a bit line BL. The conductive layer 130 is electrically connected to a lower surface of the conductive line 108. Note that the conductive line 108 is formed from, for example, tungsten (W), and functions as a source line SL.

Furthermore, the memory cell array 1 includes a beam columnar body 109. The beam columnar body 109 supports a posture of an inter-layer insulating layer not illustrated disposed between the conductive layers 102 to 104, in a manufacturing step.

Note that hereafter, a region where the plurality of memory columnar bodies 105 are disposed, of the memory cell array 1 will sometimes also be referred to as "memory region 1a", and a region where the contact portions 102b to 104b of the plurality of conductive layers 102 to 104 are formed, of the memory cell array 1 will sometimes also be referred to as "contact region 1b".

Next, a structure of the memory columnar body 105 and a periphery thereof will be described.

Figure 3:
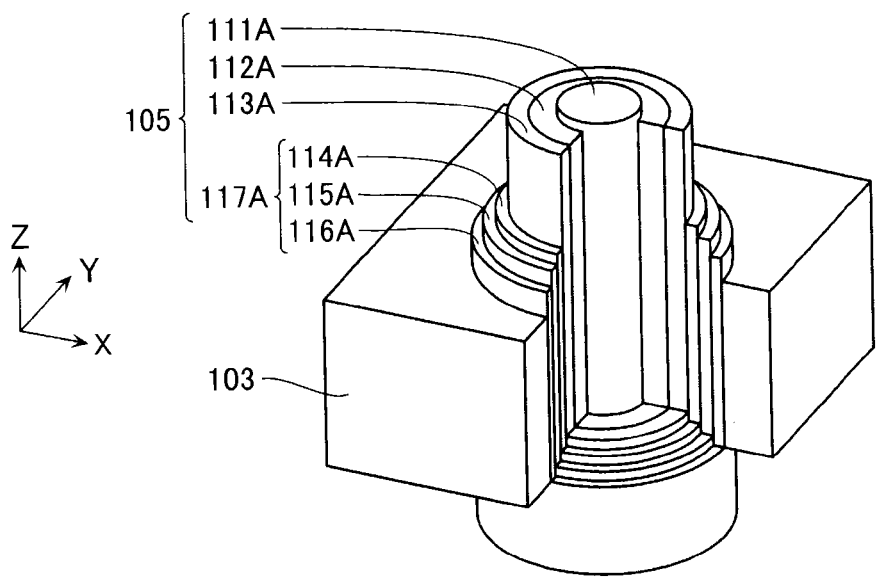
FIG. 3 is a perspective view showing a structure of a memory columnar body and a periphery thereof, of the memory cell array in the semiconductor memory device according to the embodiment.

FIG. 3 is a perspective view showing the structure of the memory columnar body and the periphery thereof, of the memory cell array in the semiconductor memory device according to the embodiment.

The memory columnar body 105 includes the following stacked from the center to the outside thereof, namely: a core insulating film 111A; semiconductor films 112A and 113A; and a multi-layer film 117A. The multi-layer film 117A includes: a tunnel insulating film 114A; a charge accumulation film 115A; and a block insulating film 116A. The core insulating film 111A is formed from, for example, silicon oxide ($SiO_2$). The semiconductor films 112A and 113A are formed from, for example, silicon (Si), silicon-germanium (Si—Ge), silicon carbide (SiC), germanium (Ge), and carbon (C). The tunnel insulating film 114A and the block insulating film 116A, in addition to being formed from silicon oxide ($SiO_x$), are formed from, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO. The charge accumulation film 115A is formed from, for example, silicon nitride (SiN). Note that the tunnel insulating film 114A and the charge accumulation film 115A may be formed in an entire longer direction of the memory columnar body 105, or may be formed only at positions of side surfaces of the conductive layers 102 to 104. Moreover, the semiconductor films 112A and 113A may be one semiconductor film.

As a result of the structure described above using FIGS. 2 and 3, the source side select transistor STS is configured at the intersection of the conductive layer 102 and the memory columnar body 105; the memory transistor MT is configured at the intersection of the conductive layer 103 and the memory columnar body 105; and the drain side select transistor STD is configured at the intersection of the conductive layer 104 and the memory columnar body 105. Hereafter, a group of the plurality of memory transistors MT sharing one memory columnar body 105 will be referred to as "memory string MS", and a group of the memory string MS and the select transistors STS and STD sharing one memory columnar body 105 will be referred to as "memory unit MU".

Next, an equivalent circuit of the memory unit MU will be mentioned.

Figure 4:
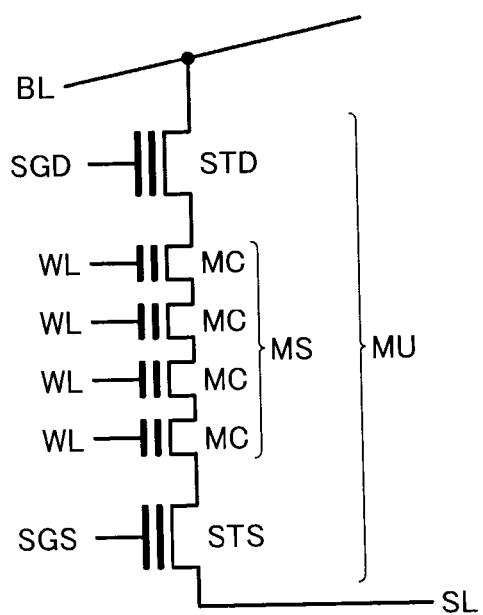
FIG. 4 is an equivalent circuit diagram of a memory unit of the memory cell array in the semiconductor memory device according to the embodiment.

FIG. 4 is an equivalent circuit diagram of the memory unit of the memory cell array in the semiconductor memory device according to the embodiment.

Each of the memory units MU of the memory cell array 1 includes: the memory string MS; a plurality of the source side select transistors STS; and a plurality of the drain side select transistors STD. The memory string MS includes a plurality of the memory transistors MT. The source side select transistor STS is connected between the source line SL and a lower end of the memory string MS. The drain side select transistor STD is connected between the bit line BL and an upper end of the memory string MS. These source side select transistor STS, memory transistors MT, and drain side select transistor STD are connected in series from the source line SL to the bit line BL.

Next, the structure of the memory cell array 1 will be described in detail.

Figure 5:
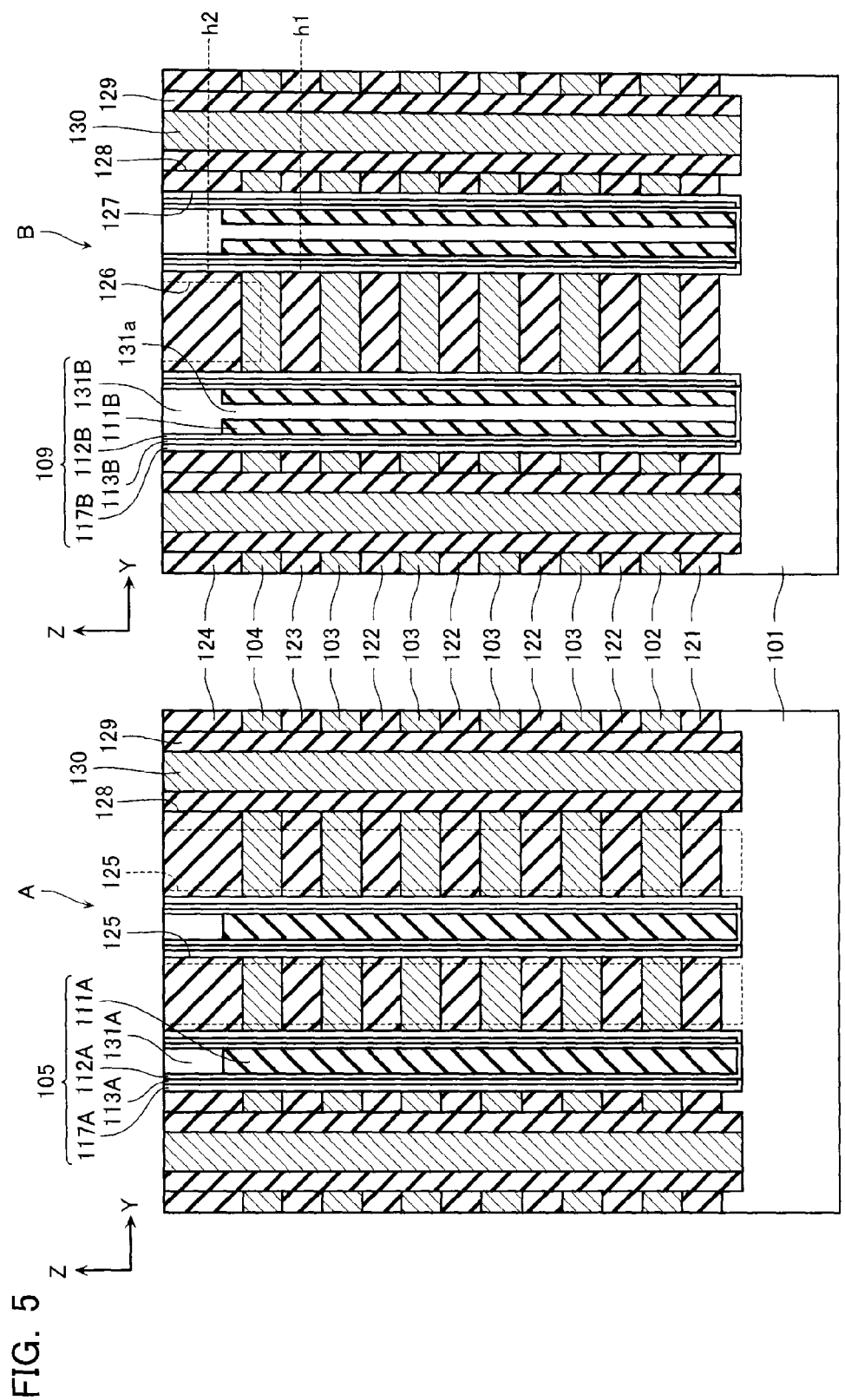
FIGS. 5 and 6 are cross-sectional views of the memory cell array in the semiconductor memory device according to the embodiment.
Figure 6:
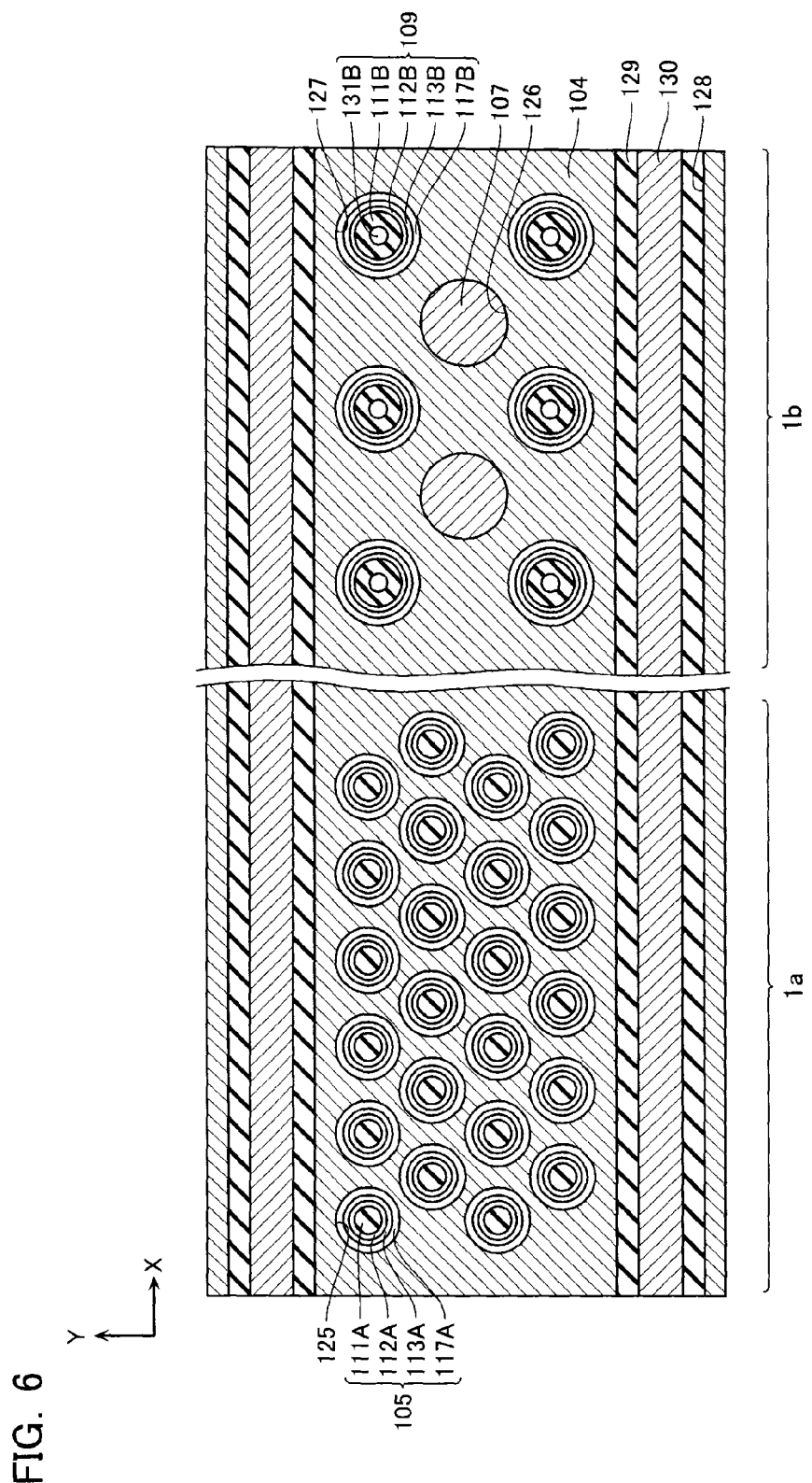

FIGS. 5 and 6 are cross-sectional views of the memory cell array in the semiconductor memory device according to the embodiment. A in FIG. 5 is a cross-sectional view in the Y-Z directions of the memory region 1a; and B in FIG. 5 is a cross-sectional view in the Y-Z directions of the contact region 1b. Moreover, FIG. 6 is a cross-sectional view in the X-Y directions at a position of the conductive layer 104 in the Z direction.

The memory cell array 1 includes: the conductive layer 102 stacked on the semiconductor substrate 101 via an inter-layer insulating layer 121; a plurality of the conductive layers 103 stacked on the conductive layer 102 via an inter-layer insulating layer 122; the conductive layer 104 stacked on the conductive layer 103 via an inter-layer insulating layer 123; and an inter-layer insulating layer 124 stacked on the conductive layer 104.

First, the memory region 1a of the memory cell array 1 will be described.

The memory region 1a has formed therein a plurality of memory holes 125 that penetrate in the Z direction from the inter-layer insulating layer 121 to the inter-layer insulating layer 124 and reach an upper portion of the semiconductor substrate 101, and these memory holes 125 are buried with a plurality of the memory columnar bodies 105.

The memory columnar body 105 has the multi-layer film structure shown in FIG. 3. Note that in the case of using a later-mentioned method of manufacturing the memory cell array 1, the memory columnar body 105 further includes a cap semiconductor film 131A covering an upper surface of the core insulating film 111A and functioning as an electrode of the memory columnar body 105. The cap semiconductor film 131A is formed by a material whose Young's modulus is higher than that of the core insulating film 111A. In the case that the core insulating film 111A adopts silicon oxide ($SiO_2$) as a material thereof, the cap semiconductor film 131A is formed by silicon (Si), titanium (Ti), tungsten (W), nickel silicide (NiSi), cobalt silicide (CoSi), tungsten silicide (WSi), or silicon nitride (SiN).

Next, the contact region 1b of the memory cell array 1 will be described.

The contact region 1b has formed therein a plurality of via holes 126 extending in the Z direction from an upper surface of the inter-layer insulating layer 124 to each of the conductive layers 102 to 104, and these via holes 126 are buried with a plurality of the vias 107. Moreover, the contact region 1b has formed therein a plurality of beam holes 127 that penetrate in the Z direction from the inter-layer insulating layer 121 to the inter-layer insulating layer 124 and reach the upper portion of the semiconductor substrate 101, and these beam holes 127 are buried with a plurality of the beam columnar bodies 109. These beam columnar bodies 109 are employed for maintaining a structure of the contact portions 102b to 104b of the conductive layers 102 to 104.

Furthermore, formed in the memory cell array 1 so as to sandwich a region of arrangement of the memory columnar body 105, the via 107, and the beam columnar body 109, are a plurality of trenches 128 that have the Z direction as a depth direction and have the X direction as an extension direction. This trench 128 includes a conductive layer 130 disposed via an insulating layer 129. This conductive layer 130 is electrically connected to the source line SL (not illustrated) disposed on the inter-layer insulating layer 124.

Now, a structure of the beam columnar body 109 will be described in detail.

The beam columnar body 109 has substantially the same structure as the memory columnar body 105. That is, in the case of the example of FIG. 5, the beam columnar body 109 includes: an core insulating film 111B (corresponding to 111A); semiconductor layers 112B and 113B (corresponding to 112A and 113A); a multi-layer film 117B (corresponding to 117A); and a cap semiconductor film 131B (corresponding to 131A). The multi-layer film 117B includes: a tunnel insulating film 114B (corresponding to 114A); a charge accumulation film 115B (corresponding to 115A); and a block insulating film 116B (corresponding to 116A). Each configuration of the beam columnar body 109 mentioned herein is formed by the same material as each corresponding configuration of the memory columnar body 105. Moreover, in the beam columnar body 109, similarly to in the memory columnar body 105, the cap semiconductor film 131B is disposed on the core insulating film 111B. Moreover, the core insulating film 111B and the cap semiconductor film 131B have their peripheries covered by the semiconductor layers 112B and 113B, and the multi-layer film 117B.

However, the beam columnar body 109 has a cross-section in the X-Y directions which is larger than a cross-section of the memory columnar body 105. Moreover, in the beam columnar body 109, contrary to in the memory columnar body 105, a plug shaped lower portion formed in the cap semiconductor film 131B (hereafter, sometimes also referred to as "plug portion (131a)") is buried like an anchor bolt in a central portion of the core insulating film 111B.

Although not shown in FIG. 5, there is a case in which an air gap is formed in a center portion of the core insulating film 111A of the memory region 1a and a center portion of the cap semiconductor film 131B of the contact region 1b when using the later-mentioned method of manufacturing the memory cell array 1.

In the case of FIG. 5, when a certain position lower than the uppermost layer conductive layer 104 of the plurality of conductive layers 102 to 104 in the Z direction is assumed to be h1, and a certain position higher than the conductive layer 104 in the Z direction is assumed to be h2, the core insulating film 111B and the cap semiconductor film 131B have at least the following features.

Firstly, the core insulating film 111B has an upper end higher than the position h1 and lower than the position h2. Moreover, the core insulating film 111B has a lower end lower than the position h1 reaching not higher than an upper surface of the semiconductor substrate 101.

The cap semiconductor film 131B has an upper end higher than the position h2. Moreover, the cap semiconductor film 131B has a lower end lower than the position h1 reaching not higher than the upper surface of the semiconductor substrate 101.

Secondly, the cap semiconductor film 131B is disposed on the semiconductor film 112B via the core insulating film 111B at the position h1. That is, the core insulating film 111B is disposed between the cap semiconductor film 131B and the semiconductor film 112B. Moreover, the cap semiconductor film 131B contacts the semiconductor film 112B at the position h2.

Thirdly, the cap semiconductor film 131B is sandwiched by the core insulating film 111B at the position h1. That is, the cap semiconductor film 131B has its periphery covered by the core insulating film 111B at the position h1. Moreover, the cap semiconductor film 131B is formed so as to contact the semiconductor film 112B at the position h2.

Next, a method of manufacturing the memory cell array 1 will be described.

FIGS. 7 to 27 are cross-sectional views explaining manufacturing steps of the memory cell array in the semiconductor memory device according to the embodiment. A in FIGS. 7, 9, 11, 13, 15, 17, 19, 20, 22, 24, and 26 are cross-sectional views in the Y-Z directions of the memory region 1a; and B in FIGS. 7, 9, 11, 13, 15, 17, 19, 20, 22, 24, and 26 are cross-sectional views in the Y-Z directions of the contact region 1b. Moreover, FIGS. 8, 10, 12, 14, 16, 18, 21, 23, 25, and 27 are cross-sectional views in the X-Y directions at a position of the conductive layer 104 in the Z direction.

Figure 7:
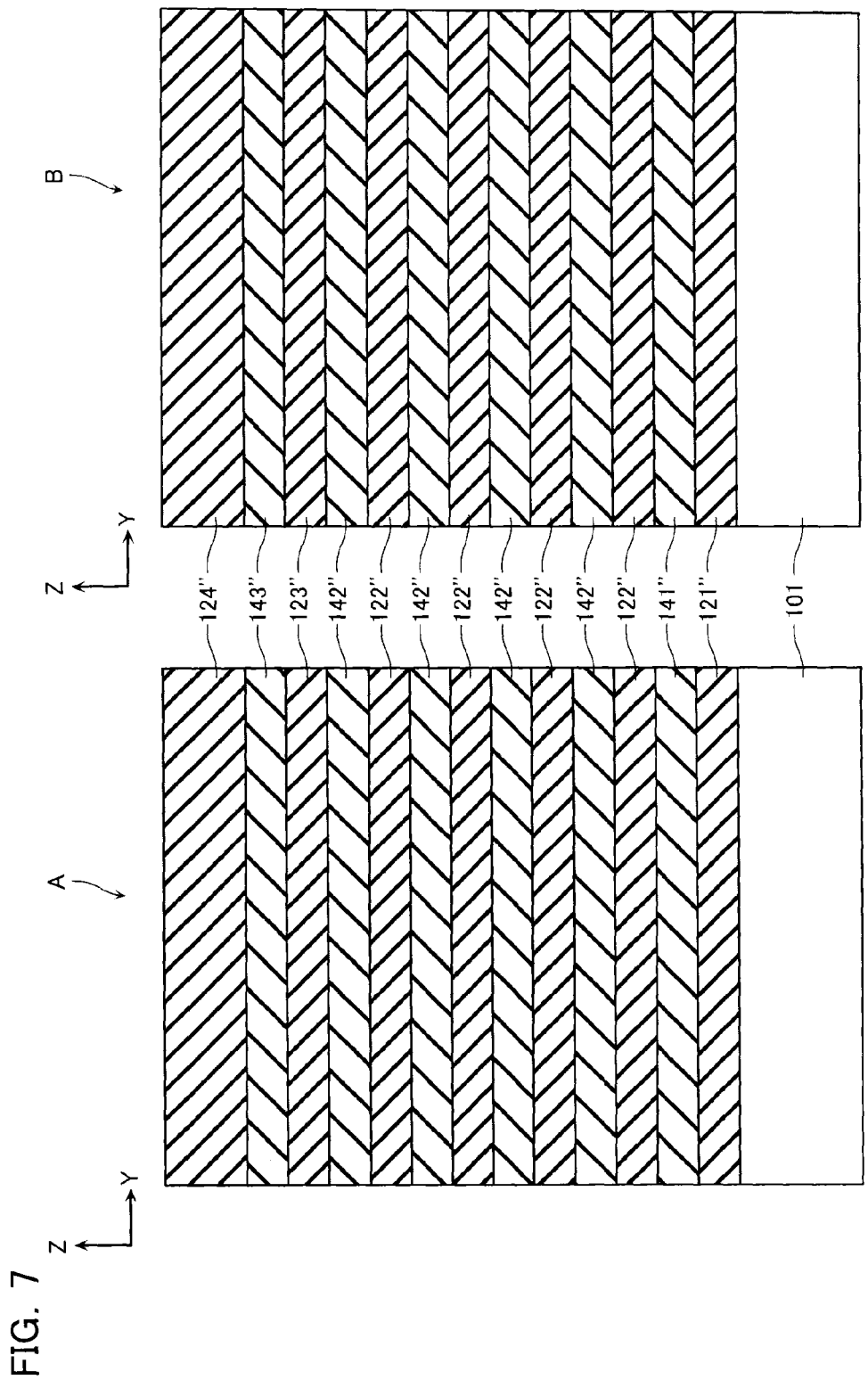
FIGS. 7 to 27 are cross-sectional views explaining manufacturing steps of the memory cell array in the semiconductor memory device according to the embodiment.
Figure 8:
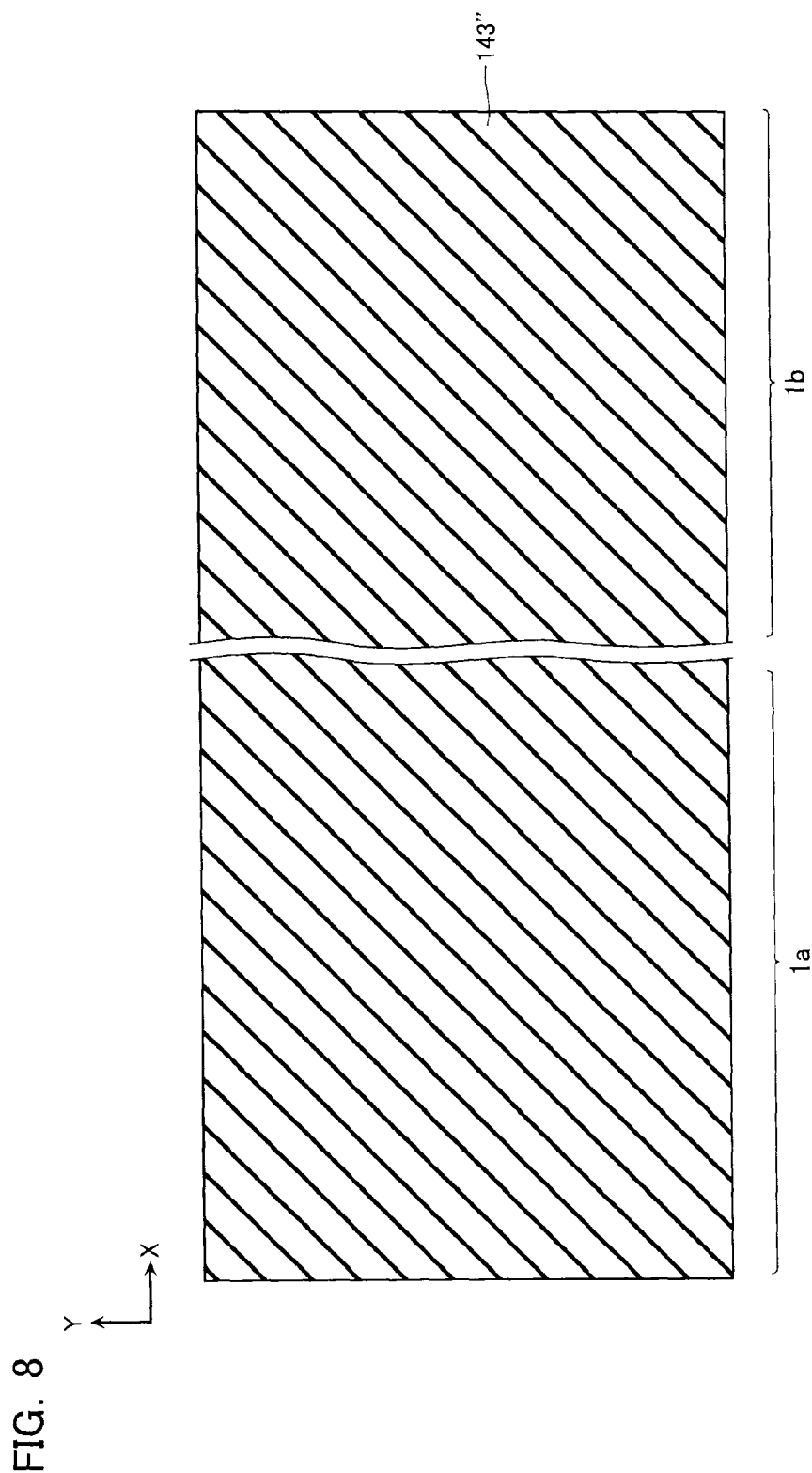

As shown in FIGS. 7 and 8, an inter-layer insulating layer 121" and a sacrifice layer 141" are stacked on the semiconductor substrate 101. Then, a plurality of inter-layer insulating layers 122" and a plurality of sacrifice layers 142" are stacked alternately on the sacrifice layer 141". Then, an inter-layer insulating layer 123", a sacrifice layer 143", and an inter-layer insulating layer 124" are stacked on the sacrifice layer 142". Now, the inter-layer insulating layers 121" to 124" are formed by, for example, silicon oxide ($SiO_2$). Moreover, the sacrifice layers 141" to 143" are formed by, for example, silicon nitride (SiN).

Figure 9:
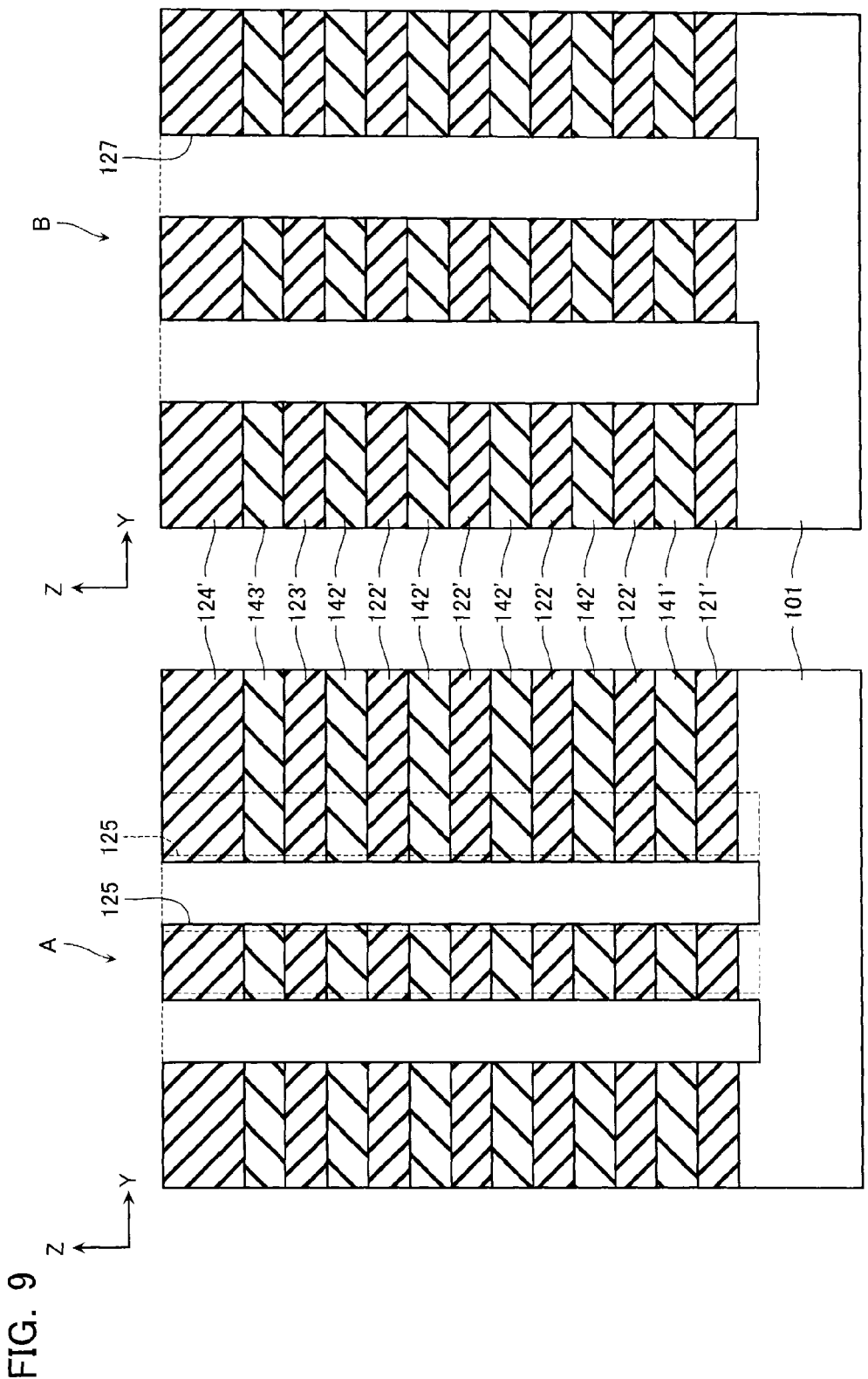
Figure 10:
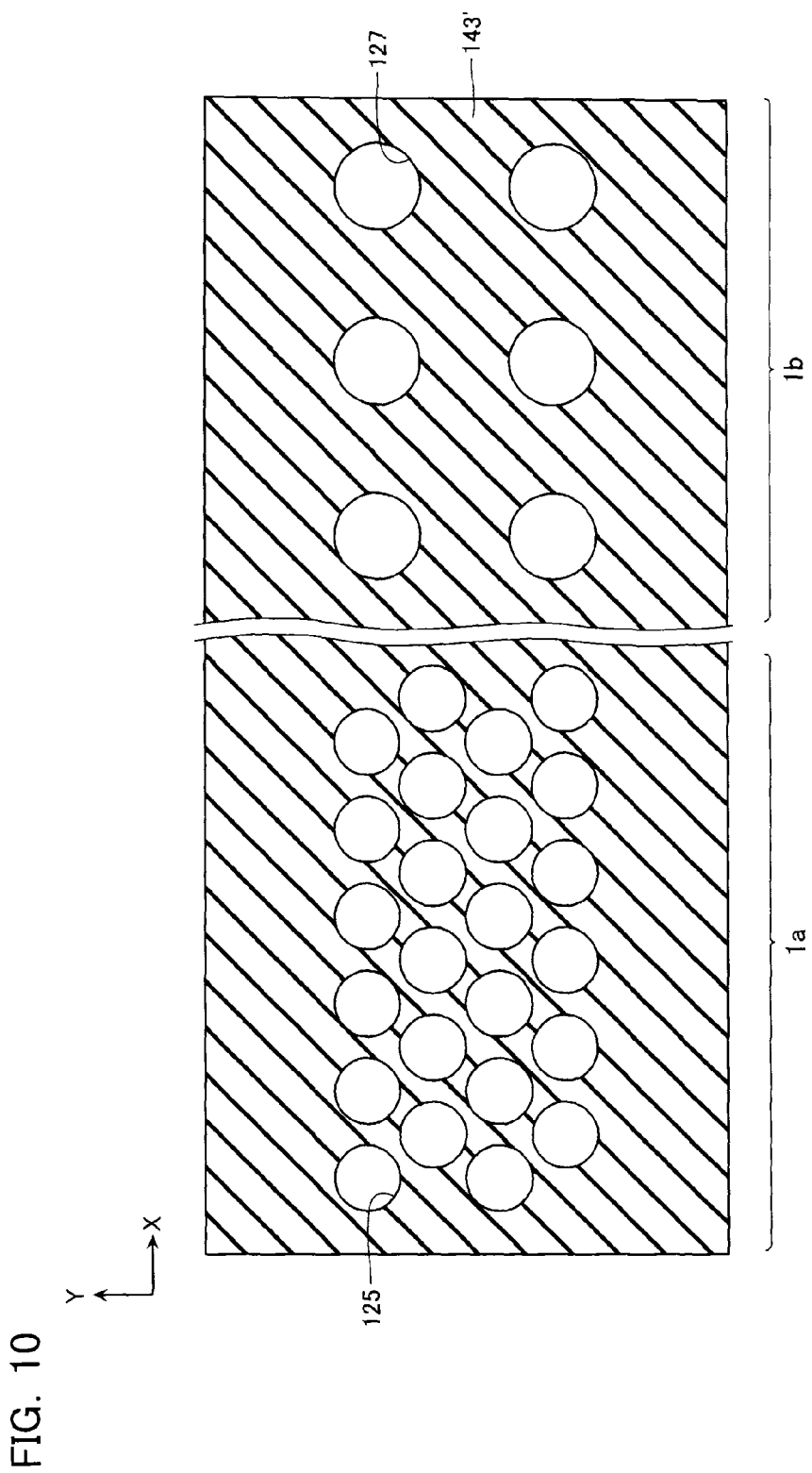

As shown in FIGS. 9 and 10, a plurality of through holes 125 and a plurality of through holes 127 extending in the Z direction to reach not higher than the upper surface of the semiconductor substrate 101 are formed in the inter-layer insulating layers 121" to 124" and the sacrifice layers 141" to 143". The through hole 125 is formed in the memory region 1a and becomes the memory hole 125. The through hole 127 is formed in the contact region 1b and becomes the beam hole 127. As a result, the inter-layer insulating layers 121' to 124' and the sacrifice layers 141' to 143' become inter-layer insulating layers 121' to 124' and sacrifice layers 141' to 143'. Now, the memory hole 125 and the beam hole 127 are formed by lithography and dry etching after having undergone exposure such that a cross-section in the X-Y directions of the beam hole 127 becomes larger than that of the memory hole 125.

Figure 11:
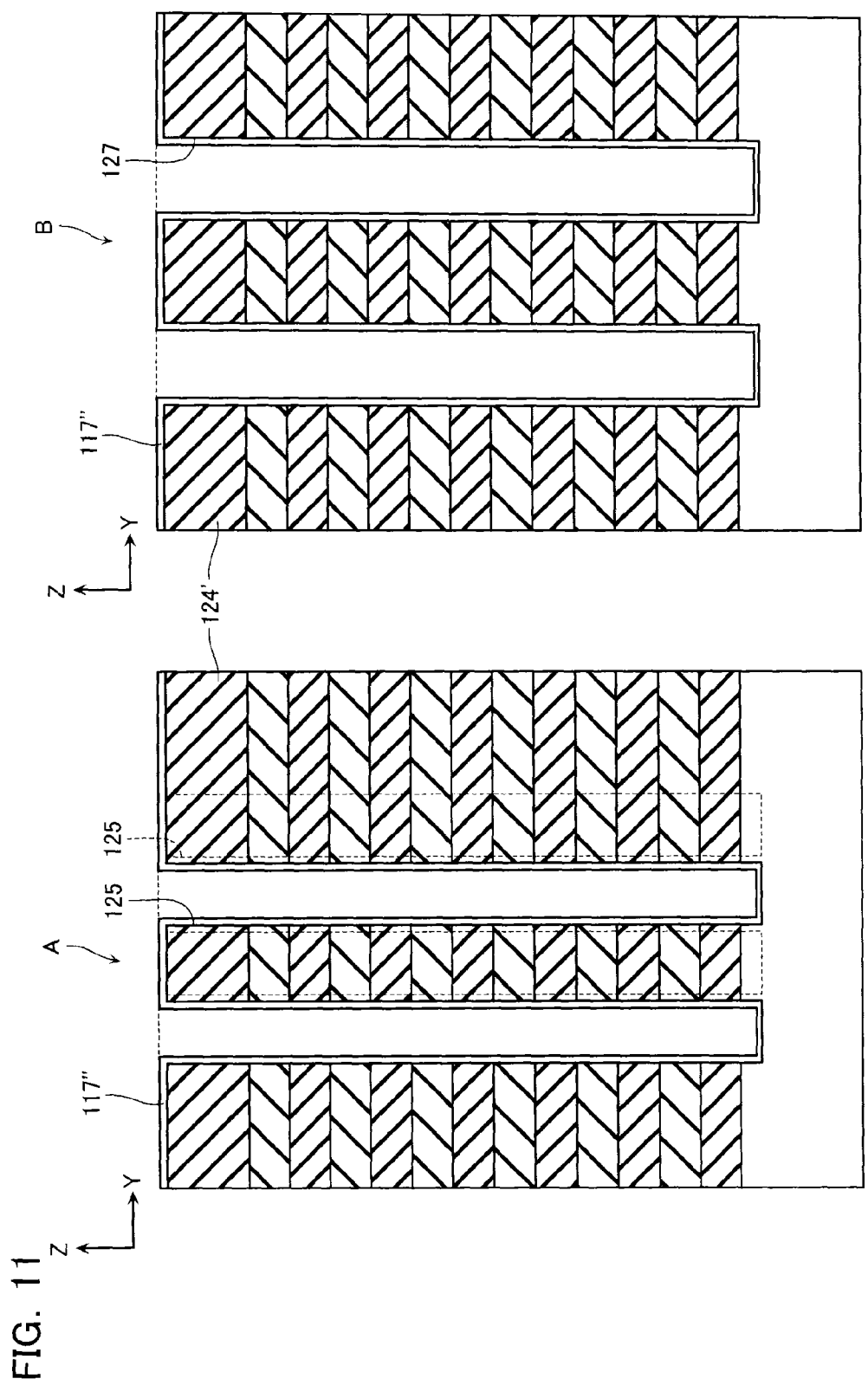
Figure 12:
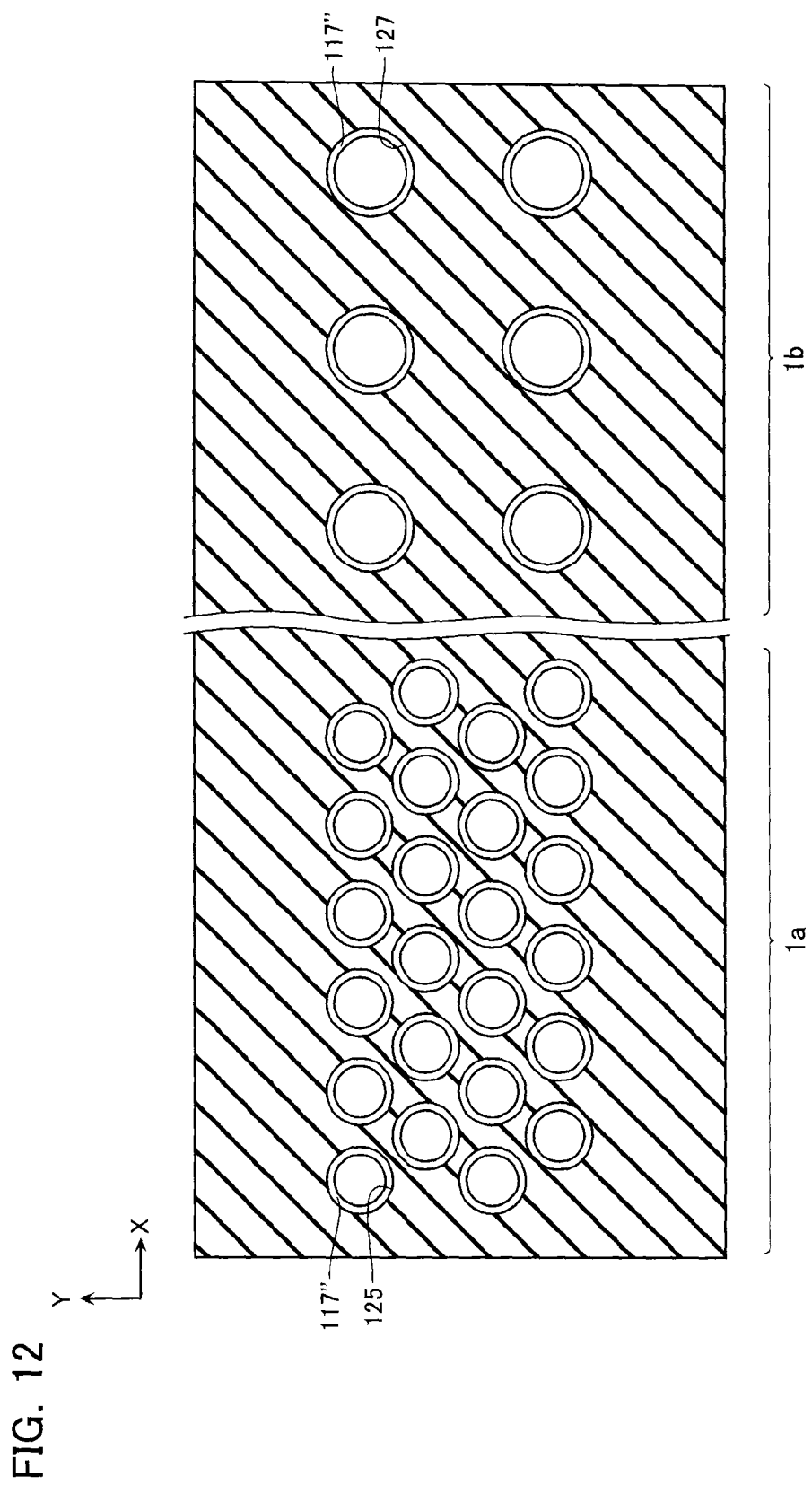

As shown in FIGS. 11 and 12, a multi-layer film 117" configured from a block insulating film 116", a charge accumulation film 115", and a tunnel insulating film 114" is deposited on an upper surface of the inter-layer insulating layer 124' and side surfaces and a bottom surface of the through holes 125 and 127. Now, the tunnel insulating films 114" and 116" are formed by, for example, silicon oxide ($SiO_2$). The charge accumulation film 115" is formed by, for example, silicon nitride (SiN).

Figure 13:
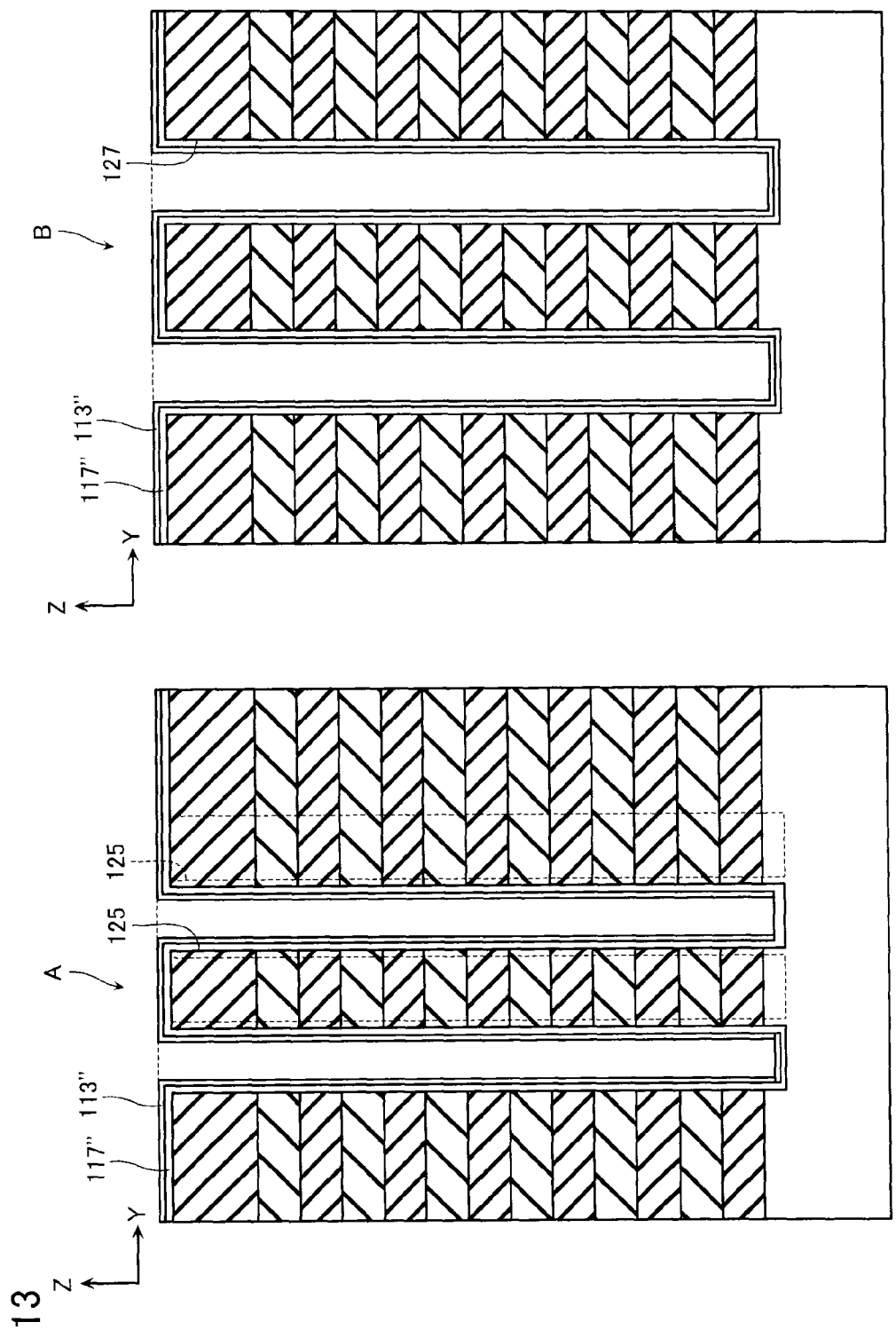
Figure 14:
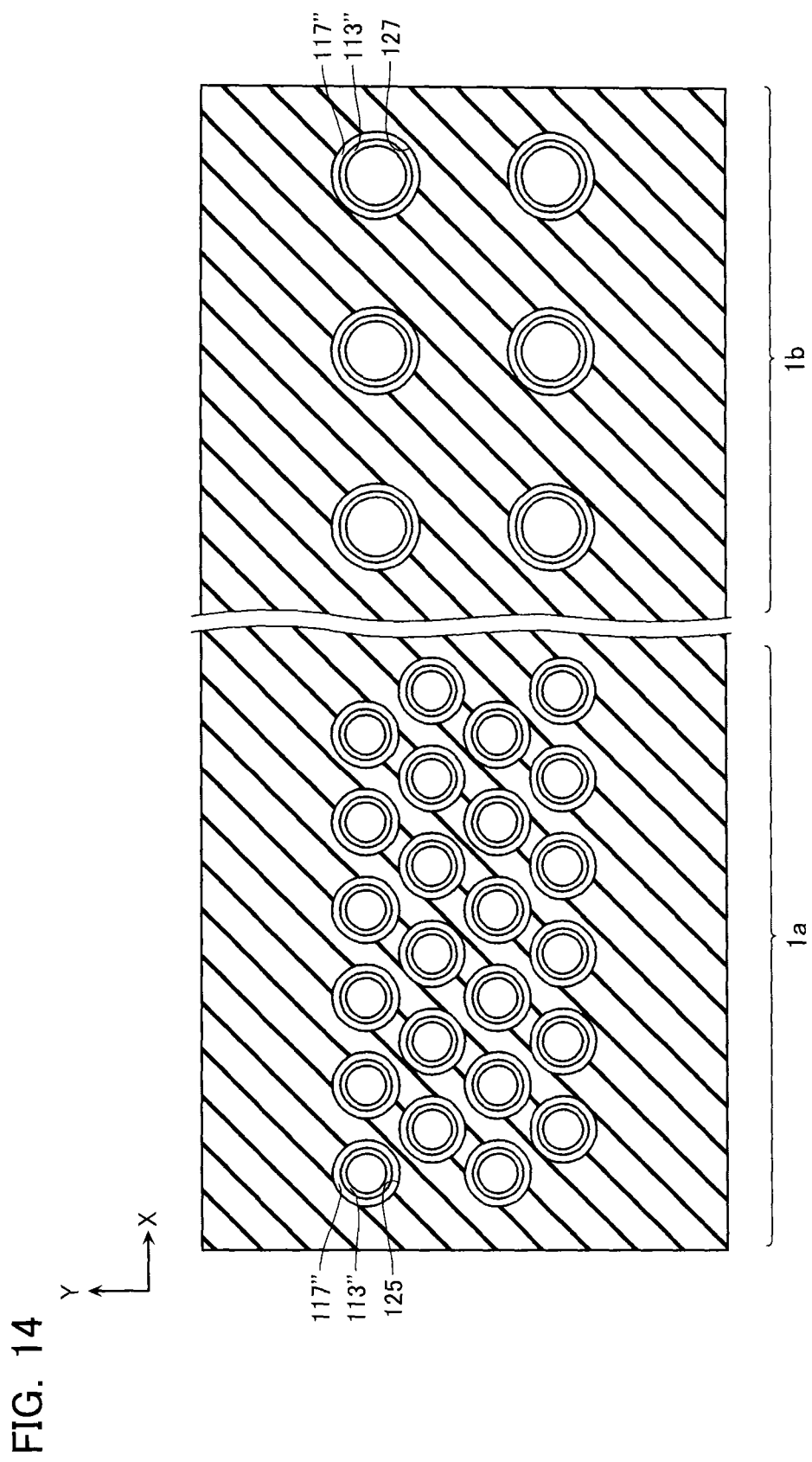

As shown in FIGS. 13 and 14, a semiconductor film 113" is deposited on the multi-layer film 117" including the side surfaces and bottom surface of the through holes 125 and 127. Now, the semiconductor film 113" is formed by, for example, polysilicon (Poly-Si).

Figure 15:
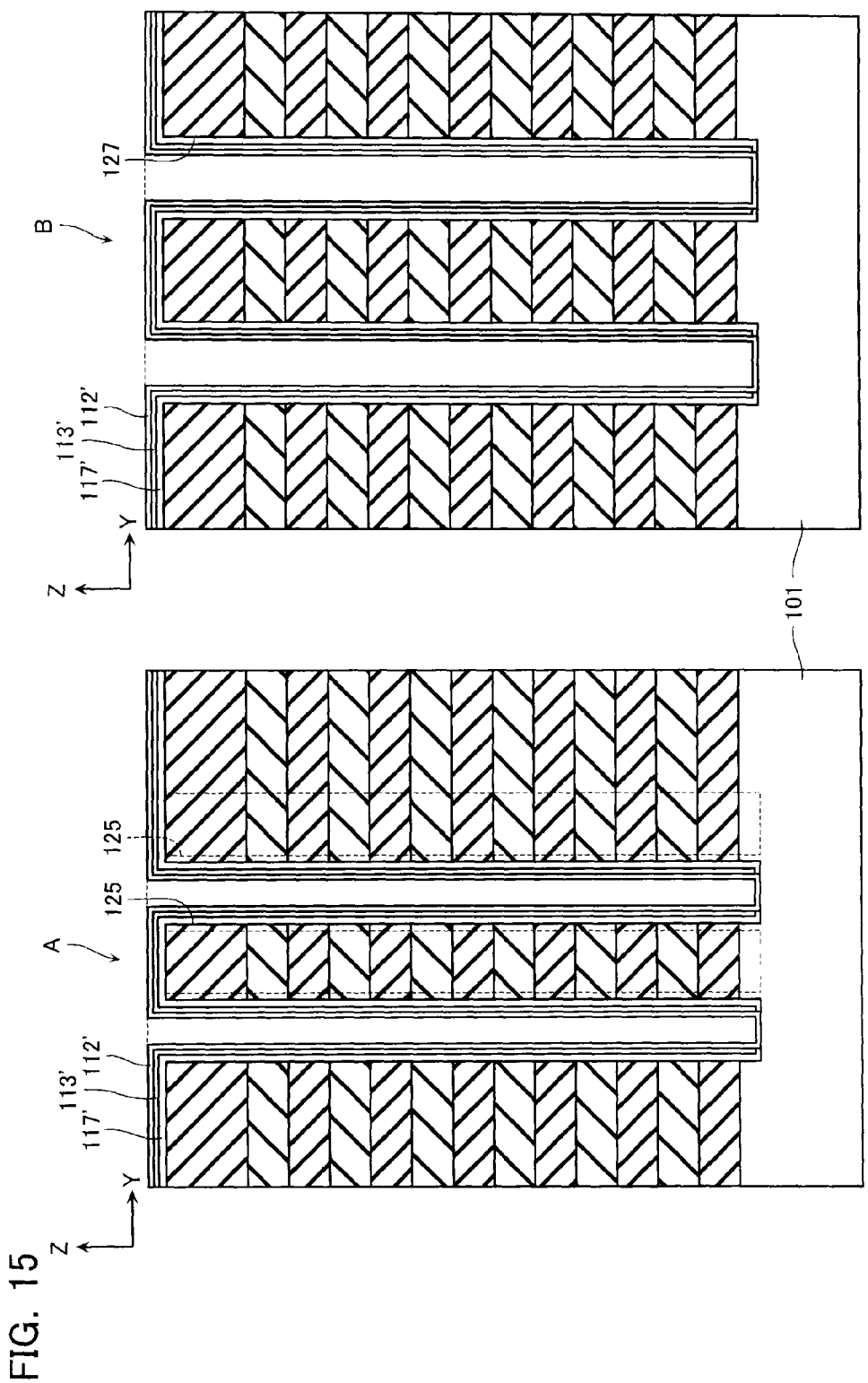
Figure 16:
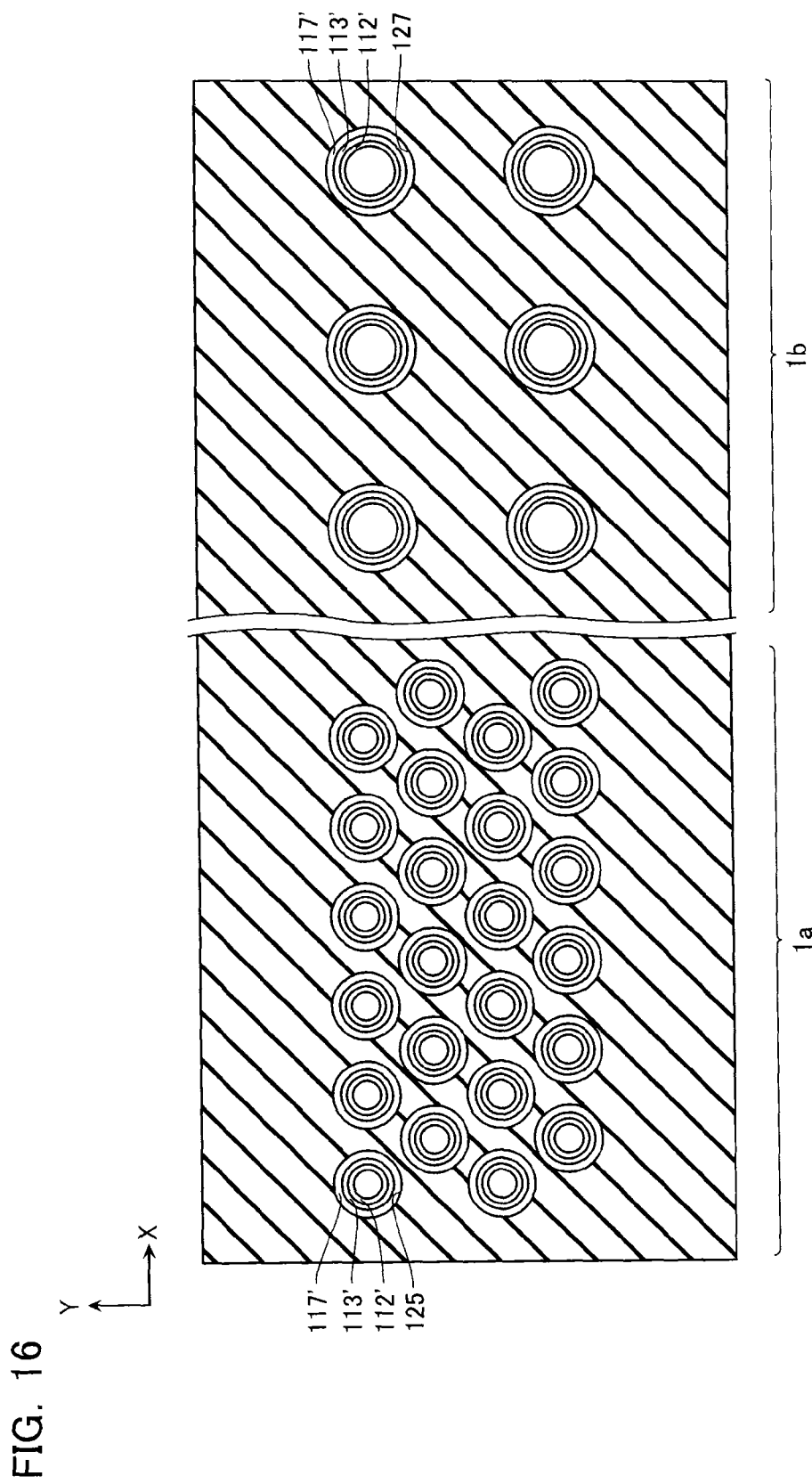

As shown in FIGS. 15 and 16, the semiconductor film 113' and the multi-layer film 117" deposited at a base of the through holes 125 and 127 is removed until the semiconductor substrate 101 is exposed at the base of the through holes 125 and 127. As a result, the semiconductor film 113" and the multi-layer film 117" become a semiconductor film 113' and a multi-layer film 117'. Then, a semiconductor film 112' is deposited on the semiconductor film 113' and the semiconductor substrate 101 including the side surfaces and bottom surface of the through holes 125 and 127. Now, the semiconductor film 112' is formed by, for example, polysilicon (Poly-Si).

Figure 17:
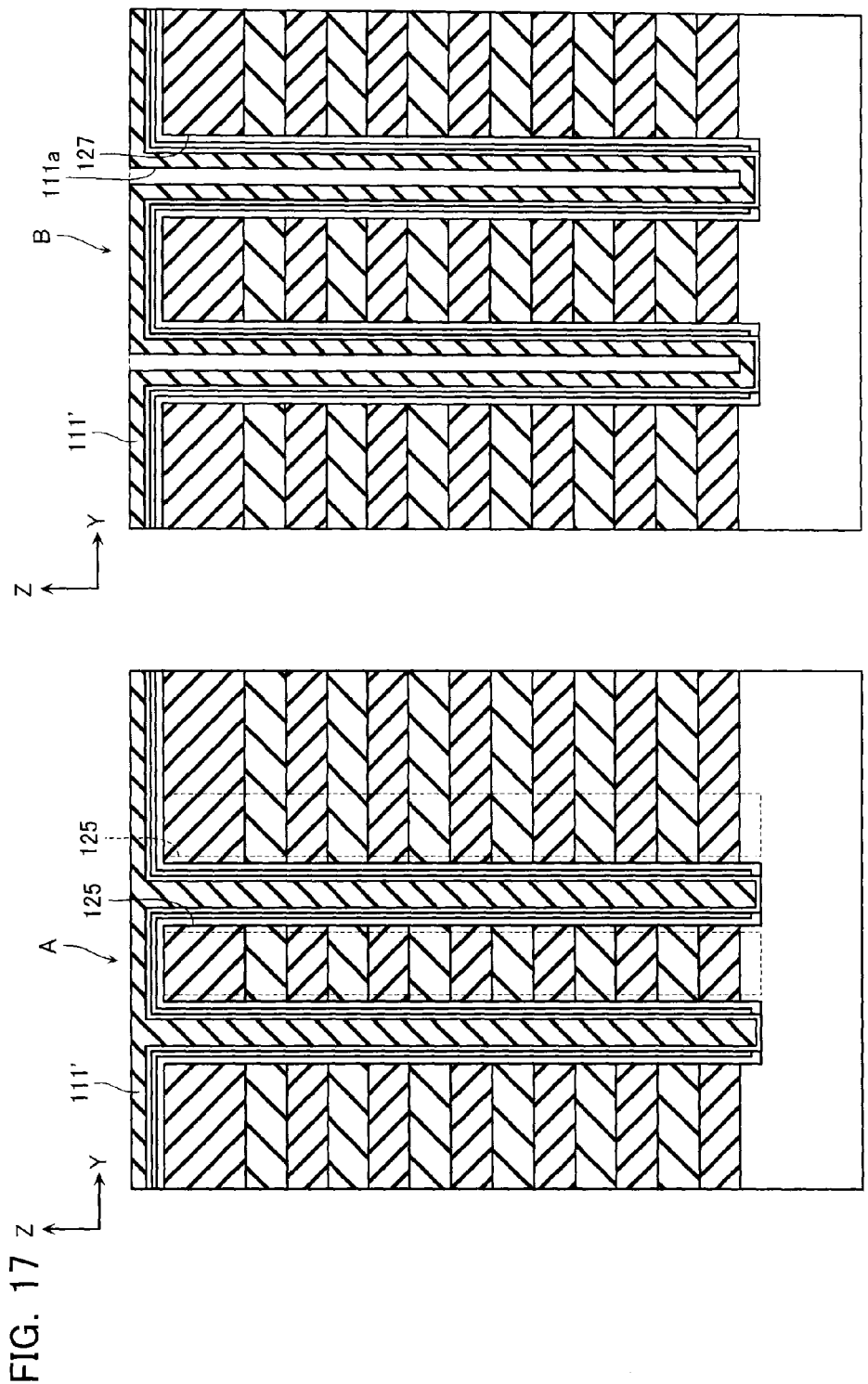
Figure 18:
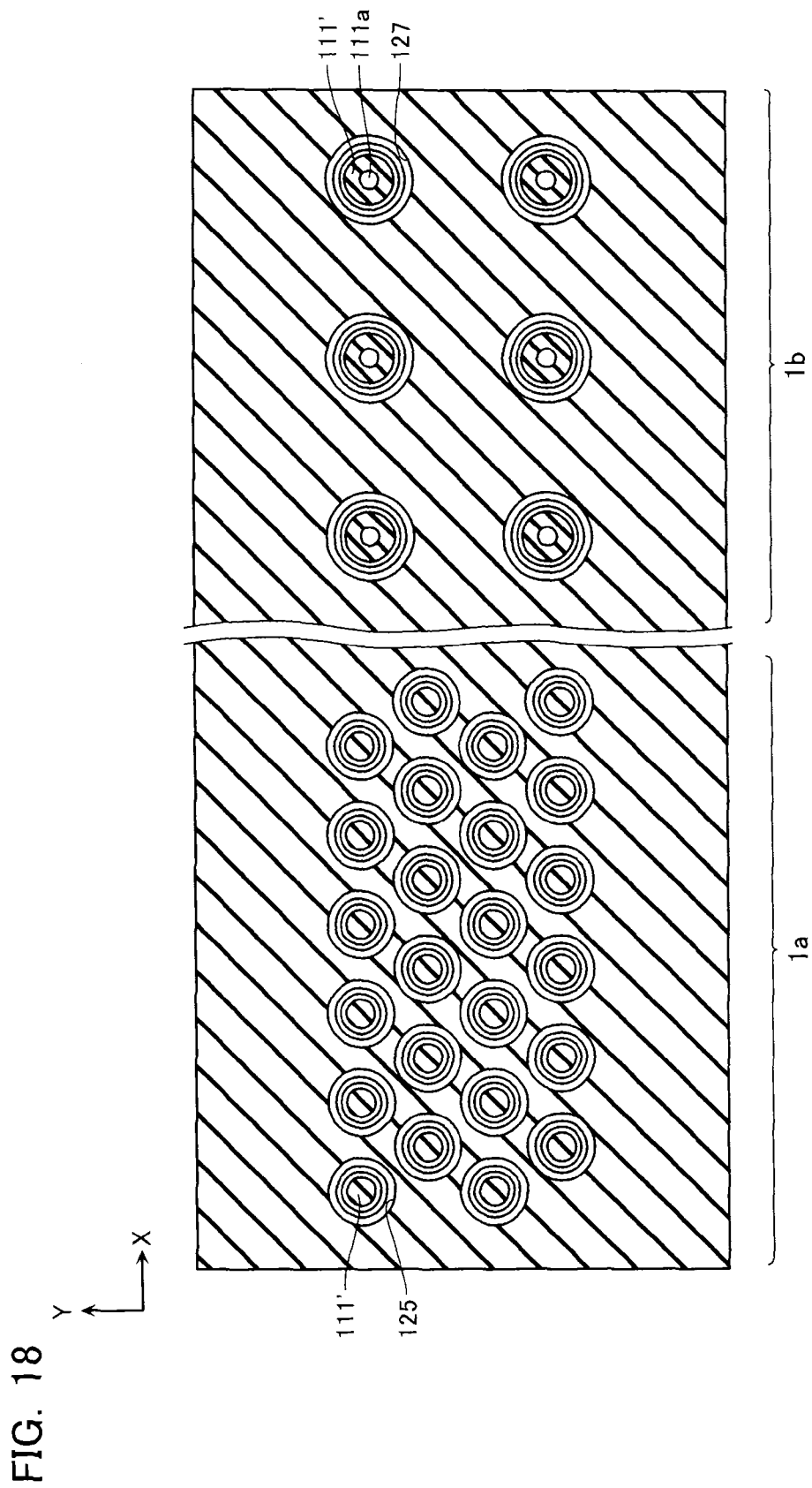

As shown in FIGS. 17 and 18, the through holes 125 and 127 are buried with an insulating film 111' to an extent that a void 111a occurs in the broad-diameter through hole 127 without a void occurring in the narrow-diameter through hole 125. Now, the insulating film 111' is formed by, for example, silicon oxide ($SiO_2$).

Figure 19:
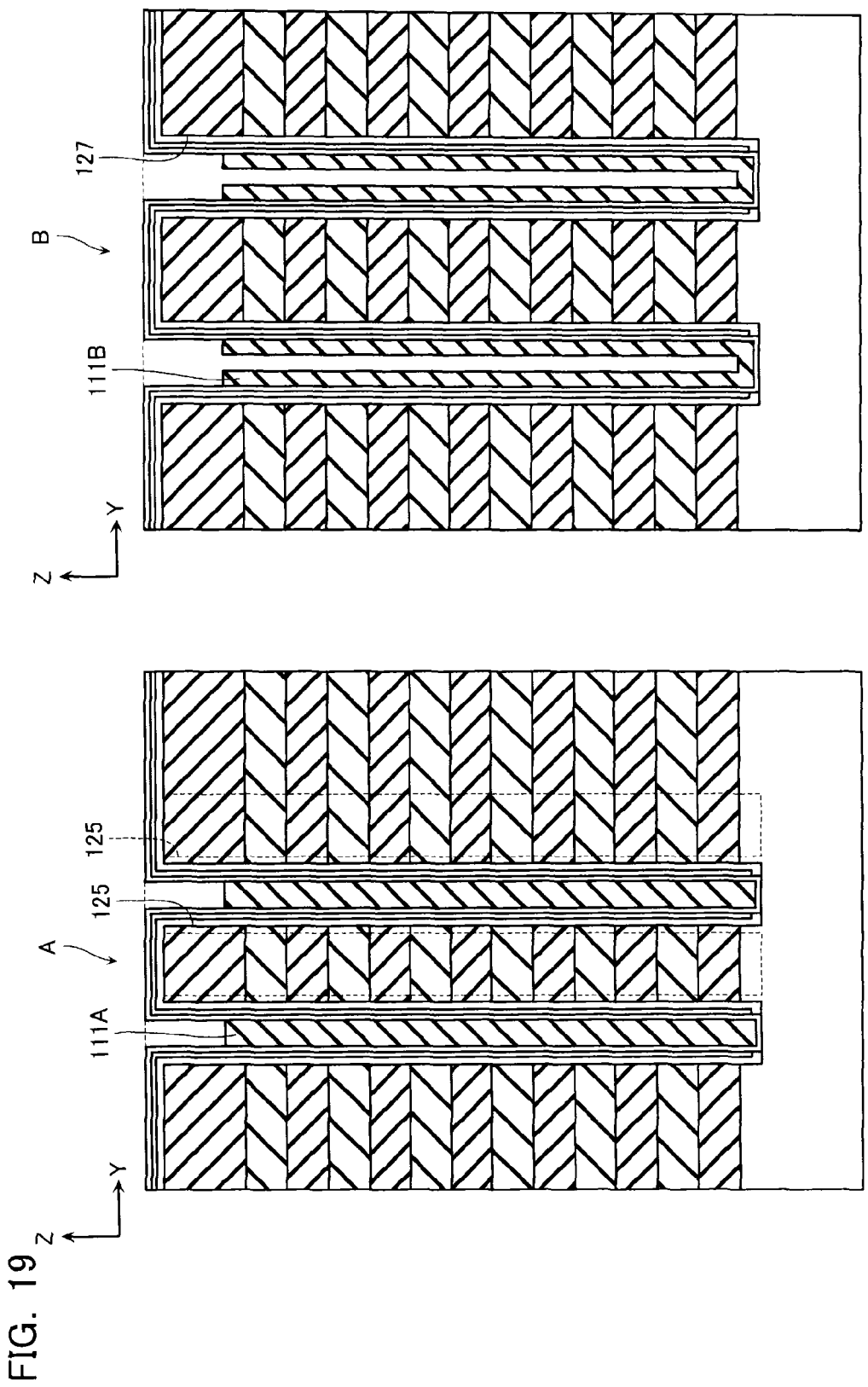

As shown in FIG. 19, the insulating film 111' in an upper portion of the through holes 125 and 127 is removed by etching. As a result, the insulating film 111' in the through hole 125 becomes the core insulating film 111A, and the insulating film 111' in the through hole 127 becomes the core insulating film 111B. Note that a cross-section in the X-Y directions of the memory cell array 1 in this step is similar to that of FIG. 18, hence is omitted.

Figure 20:
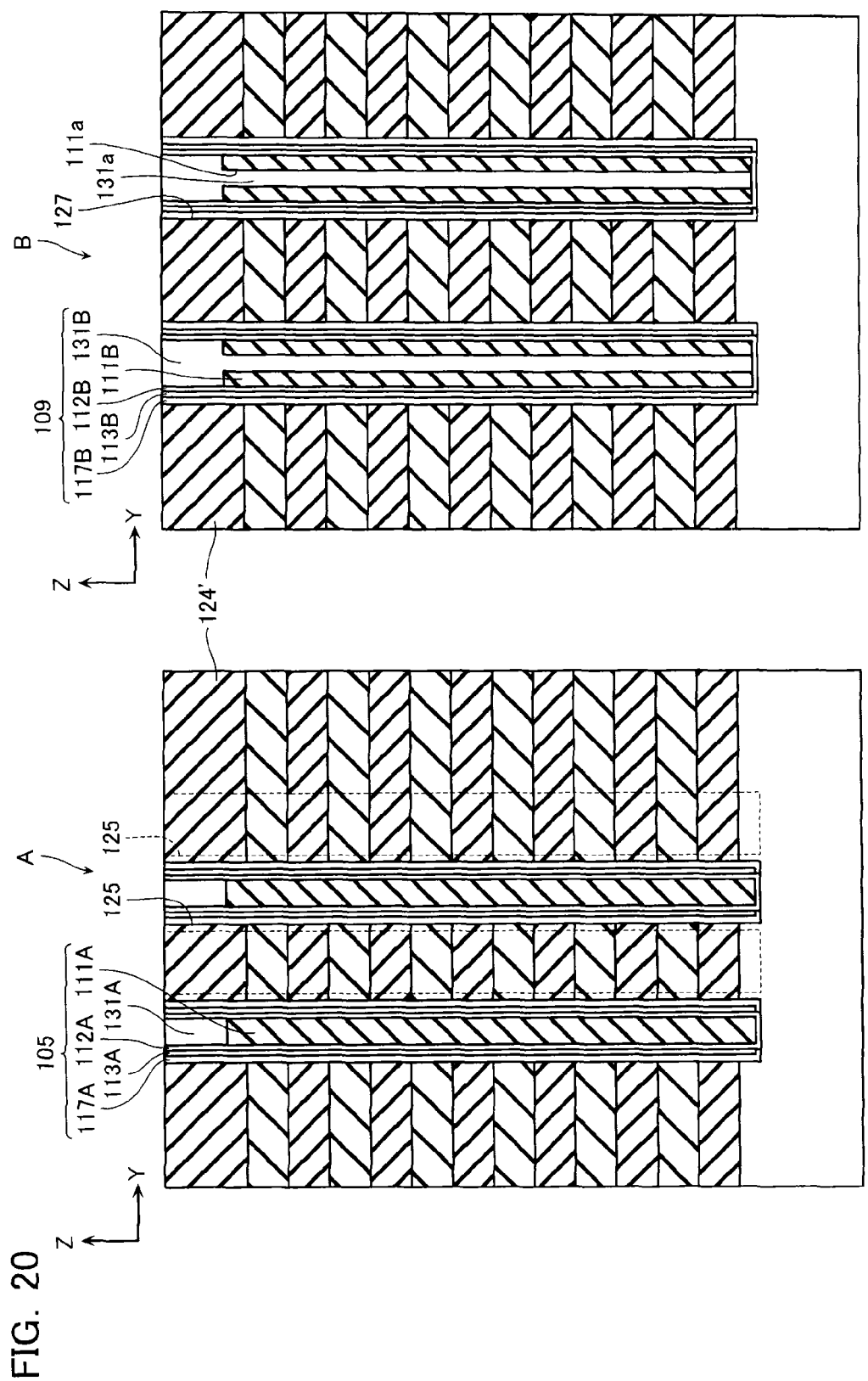
Figure 21:
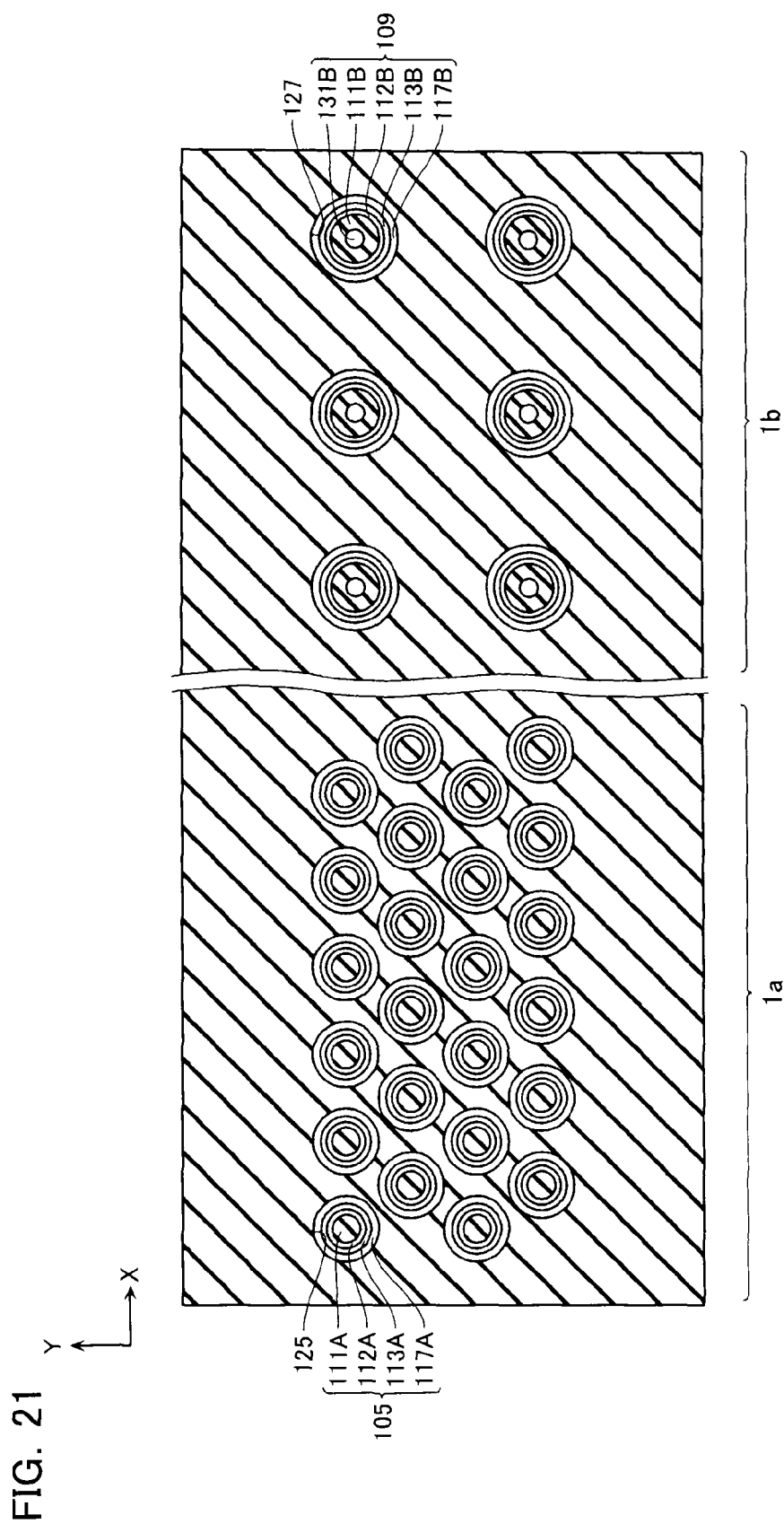

As shown in FIGS. 20 and 21, the through holes 125 and 127 are buried with a cap semiconductor film 131'. At this time, the void 111a of the core insulating film 111B is buried with a material of the cap semiconductor film 131', whereby the plug portion 131a is formed in the void 111a. Then, the semiconductor films 112' and 113', the multi-layer film 117', and the cap semiconductor film 131' are removed to an extent that an upper surface of the inter-layer insulating layer 124' is exposed. As a result, the semiconductor films 112' and 113', the multi-layer film 117', and the cap semiconductor film 131' in the memory hole 125 become the semiconductor films 112A and 113A, the multi-layer film 117A, and the cap semiconductor film 131A; and the semiconductor films 112' and 113', the multi-layer film 117', and the cap semiconductor film 131' in the beam hole 127 become the semiconductor films 112B and 113B, the multi-layer film 117B, and the cap semiconductor film 131B. In steps thus far, the memory columnar body 105 and the beam columnar body 109 are formed.

Figure 22:
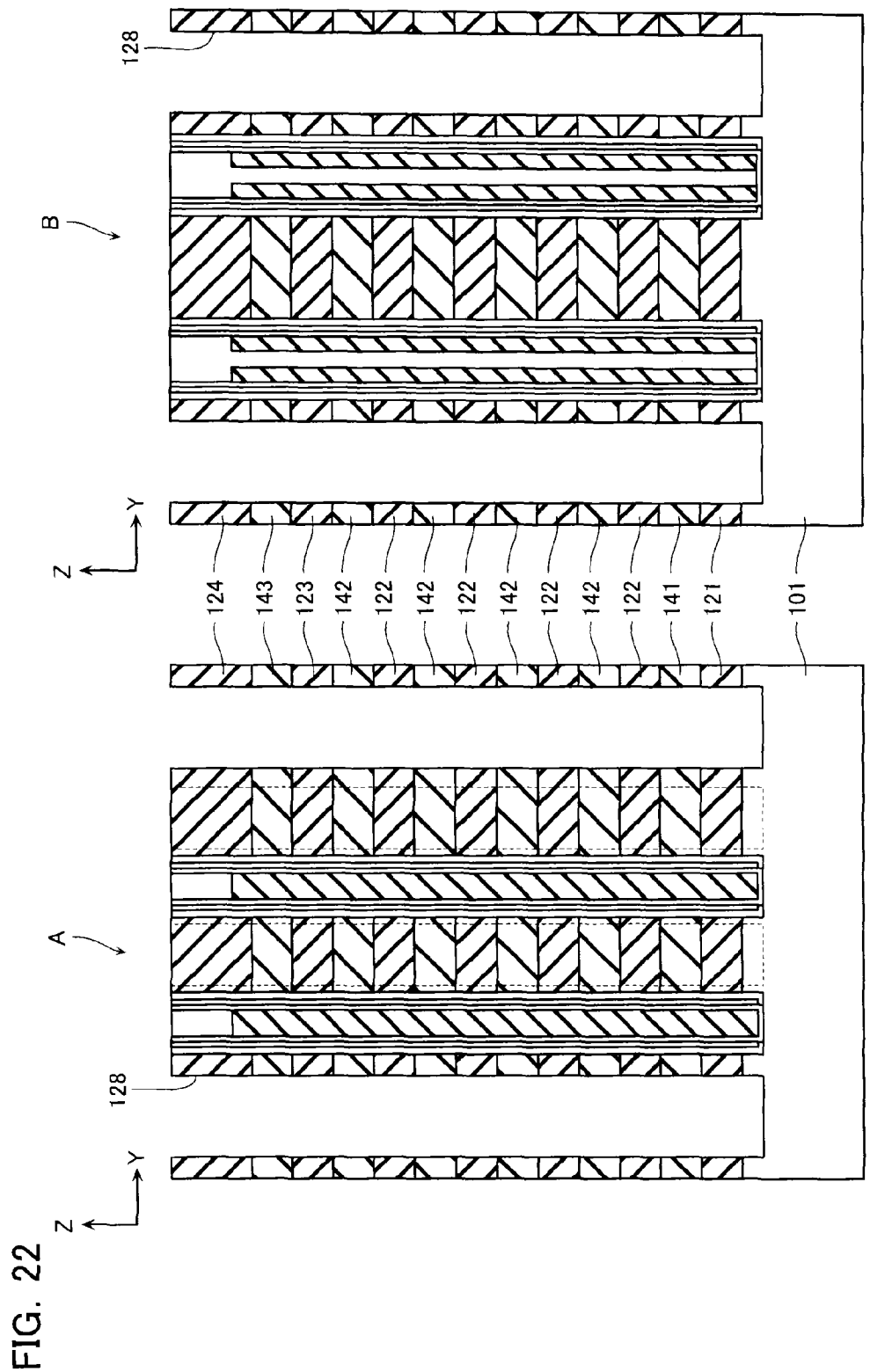
Figure 23:
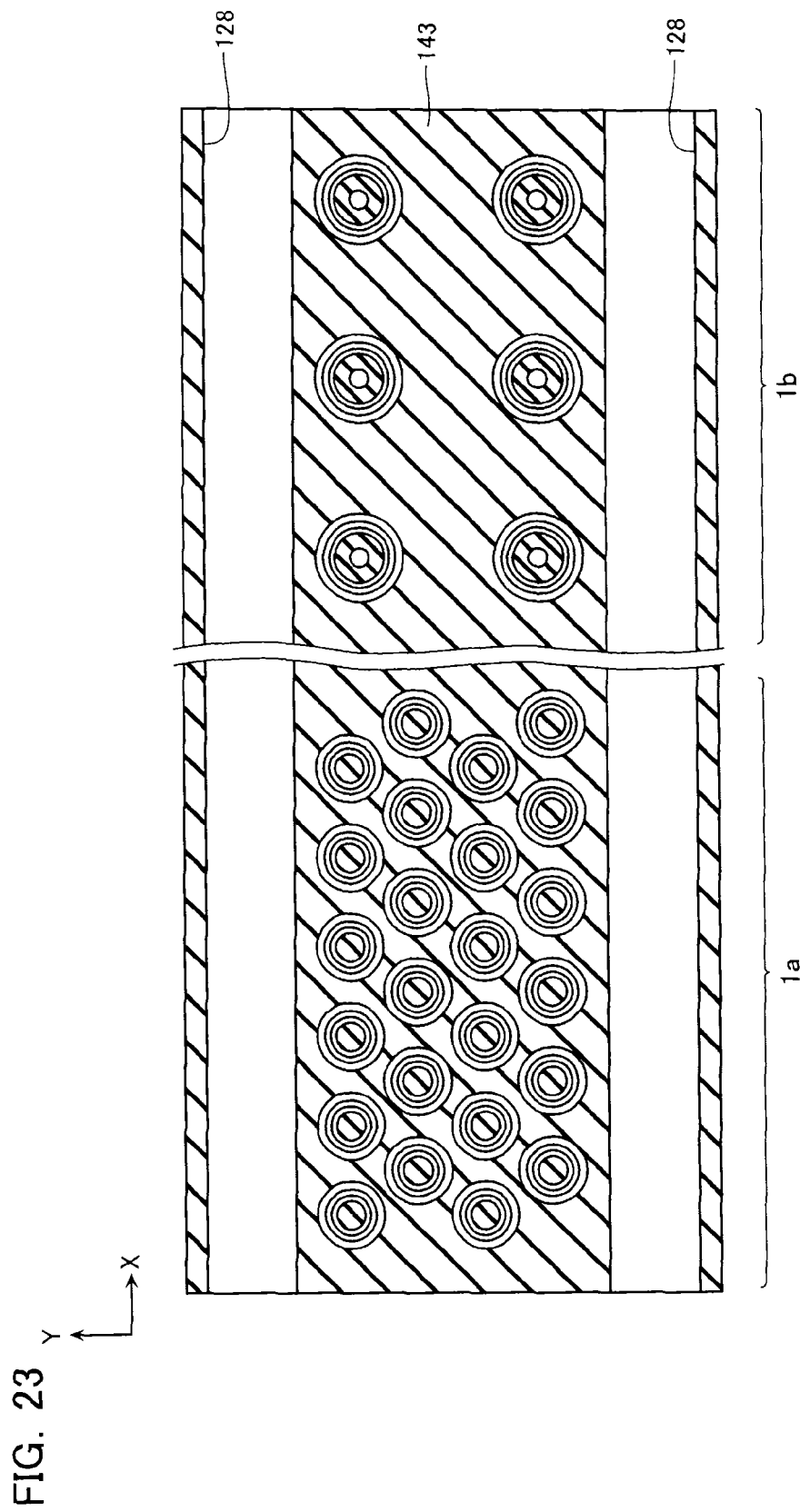

As shown in FIGS. 22 and 23, the plurality of trenches 128 having the Z direction as a depth direction and having the X direction as an extension direction are formed in the inter-layer insulating layers 121' to 124' and the sacrifice layers 141' to 143'. As a result, the inter-layer insulating layers 121' to 124' and the sacrifice layers 141' to 143' become the inter-layer insulating layers 121 to 124 and the sacrifice layers 141 to 143.

Figure 24:
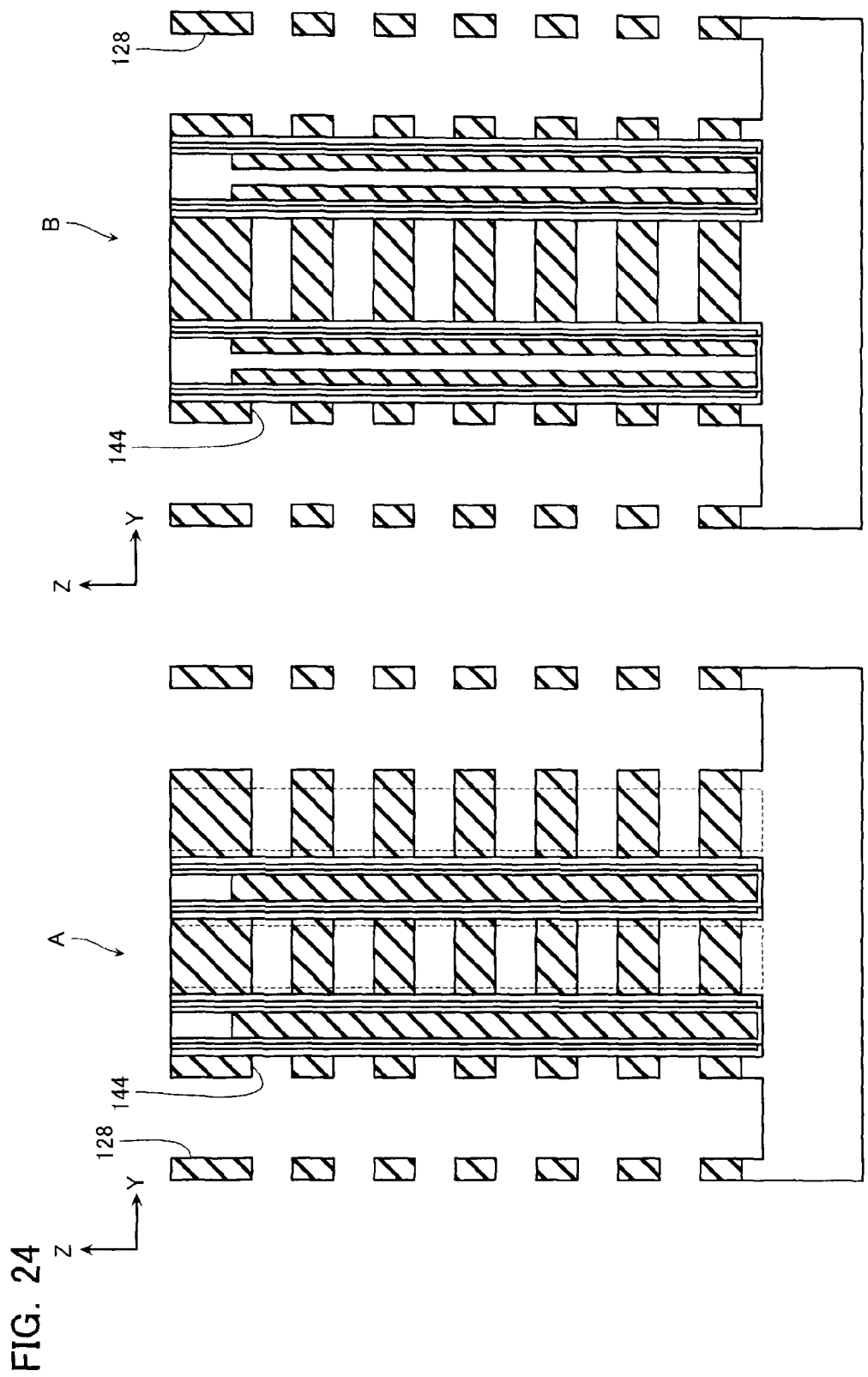
Figure 25:
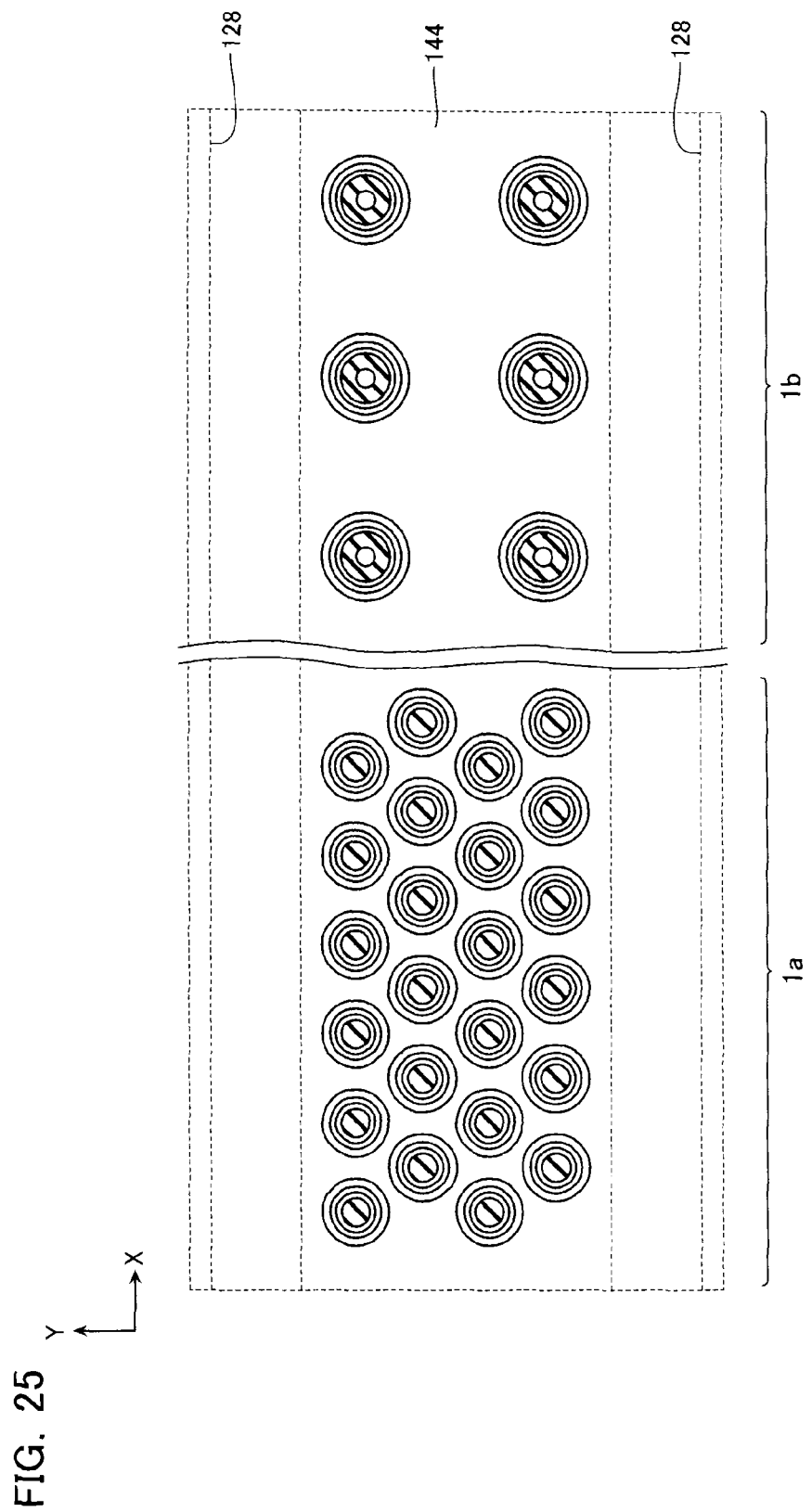

Then, as shown in FIGS. 24 and 25, the sacrifice layers 141 to 143 are removed by etching process via the trench 128. Employed in removal of the sacrifice layers 141 to 143 is, for example, wet etching using a phosphoric acid solution ($H_3PO_4$). As a result, a gap 144 is formed between the inter-layer insulating layers 121 to 124. The memory columnar body 105 is exposed in the gap 144.

Figure 26:
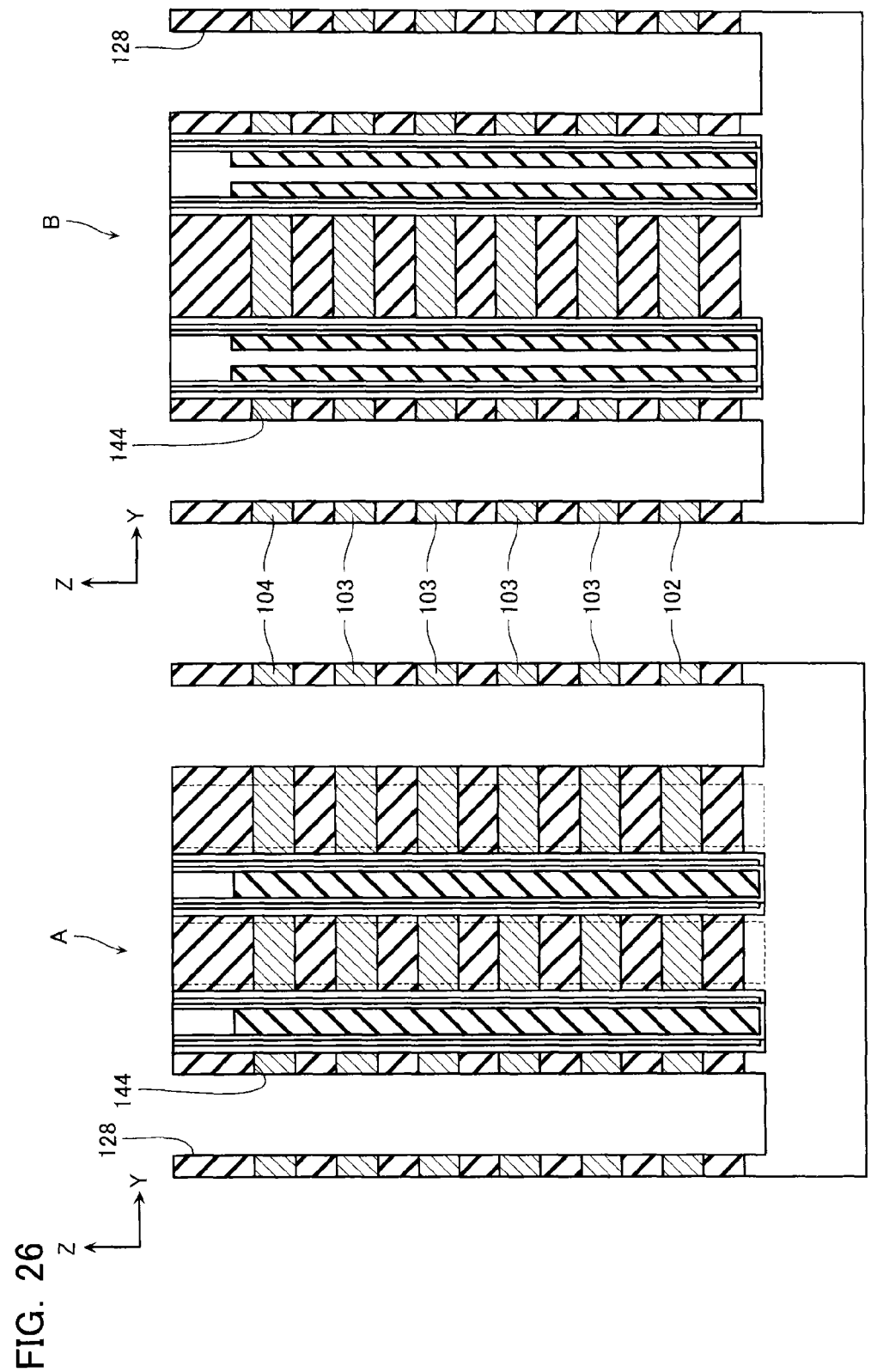
Figure 27:
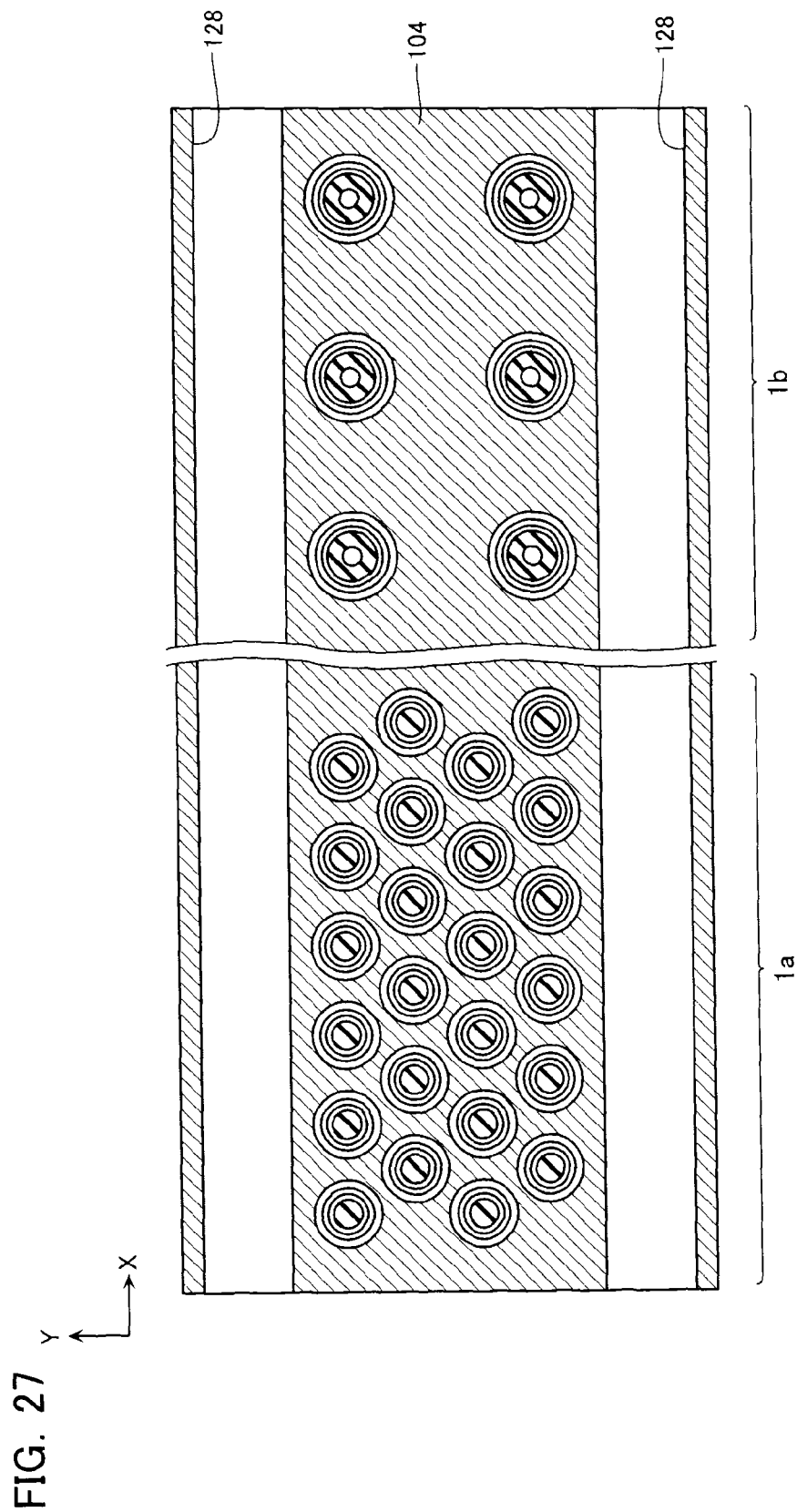

As shown in FIGS. 26 and 27, the conductive layers 102 to 104 are deposited in the gap 144 via the trench 128. Now, the conductive layers 102 to 104 are formed by, for example, tungsten (W). Next, the insulating film 129 is deposited on a sidewall of the trench 128 and then the conductive layer 130 is deposited. Finally, the via hole 126 is formed in the contact region 1b of the memory cell array 1 and is buried with the via 107, whereby the memory cell array 1 having the structure shown in FIGS. 5 and 6 is formed.

That concludes the manufacturing steps of the memory cell array 1 of the present embodiment.

Next, advantages of the present embodiment will be described using a comparative example.

Figure 28:
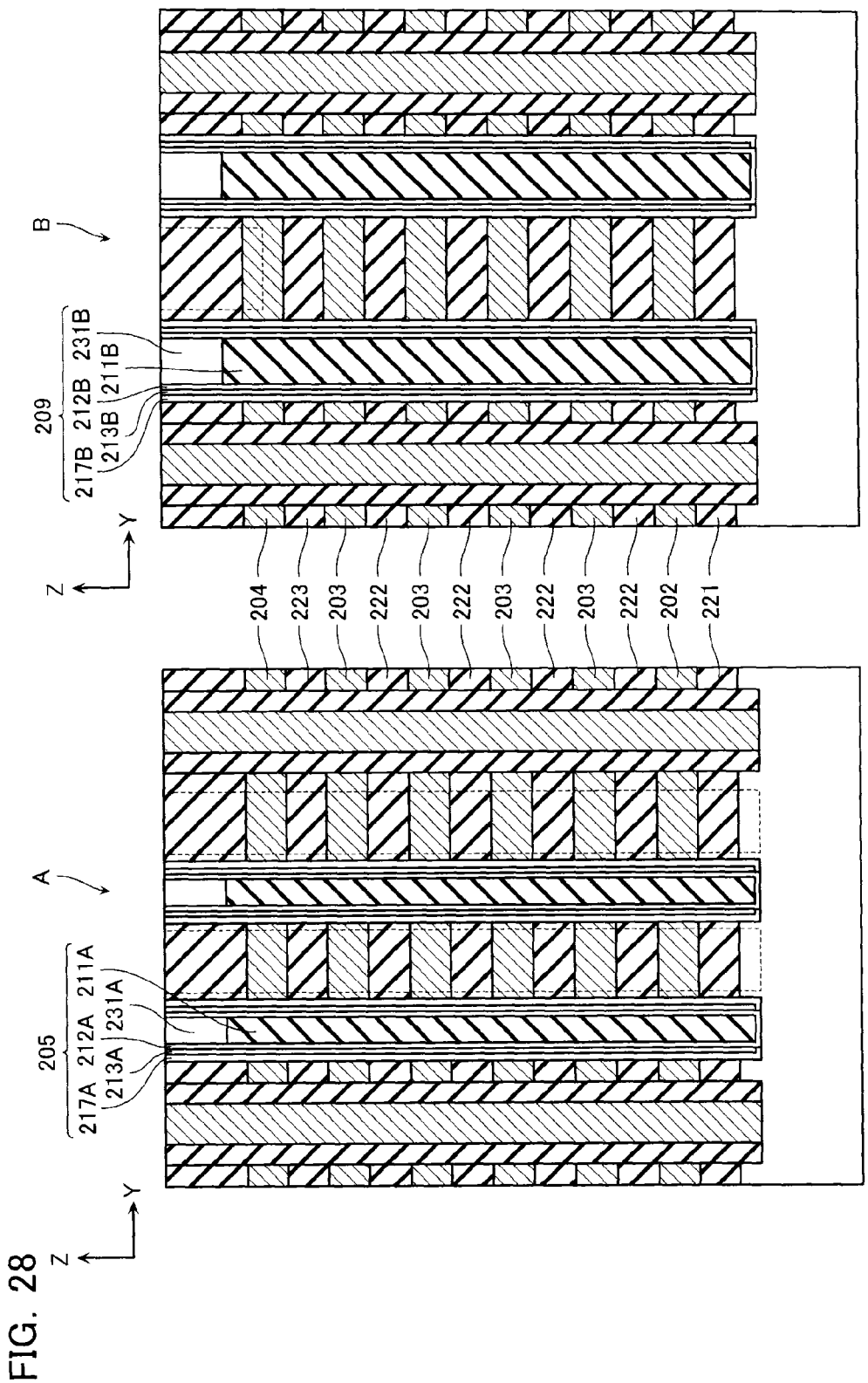
FIGS. 28 and 29 are cross-sectional views of a memory cell array in a semiconductor memory device according to a comparative example to the embodiment.
Figure 29:
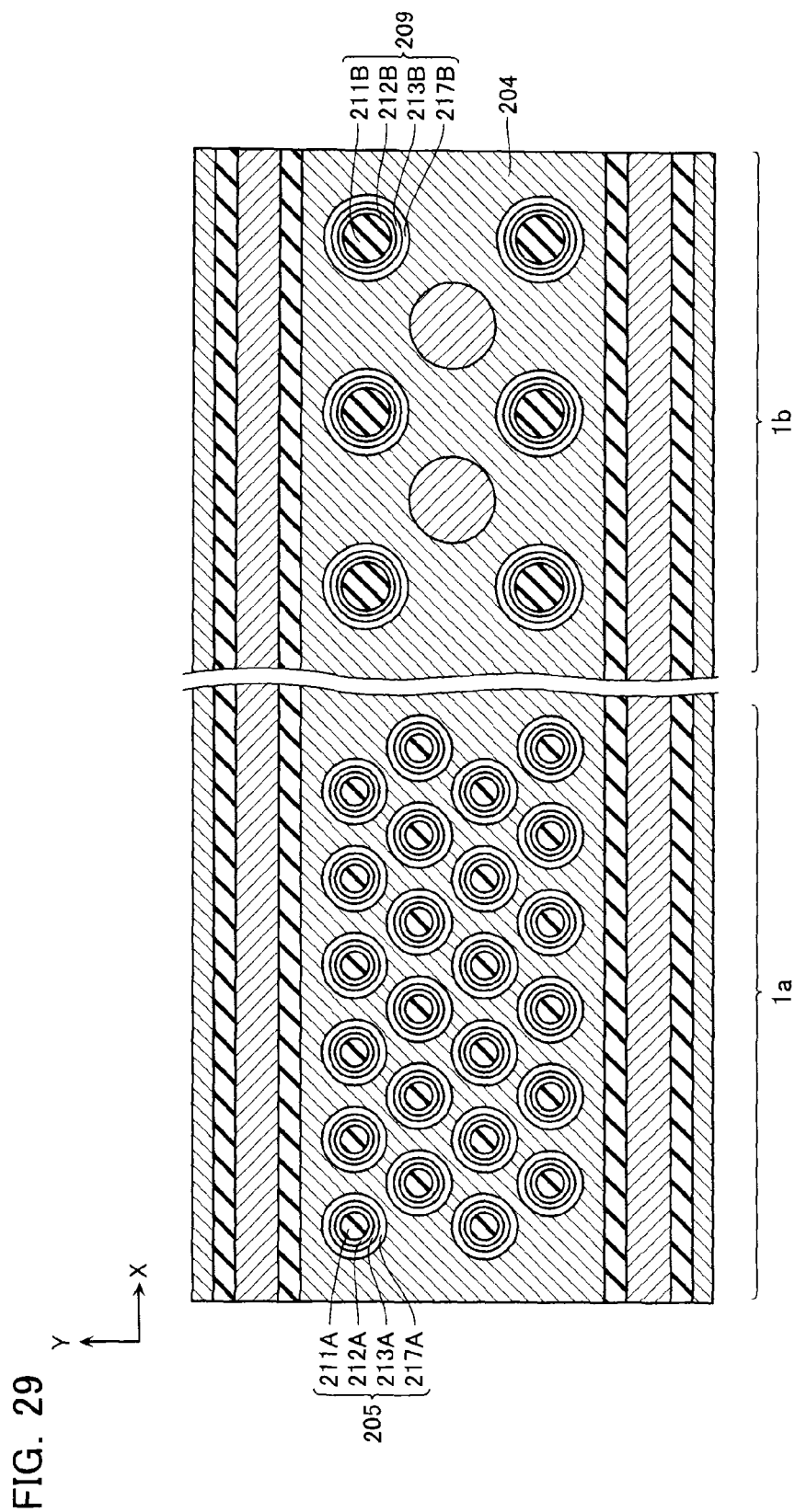

FIGS. 28 and 29 are cross-sectional views of a memory cell array in a semiconductor memory device according to a comparative example to the present embodiment. A in FIG. 28 is a cross-sectional view in the Y-Z directions of a memory region; and B in FIG. 28 is a cross-sectional view in the Y-Z directions of a contact region. Moreover, FIG. 29 is a cross-sectional view in the X-Y directions at a position of a conductive layer 204 (corresponding to 104) in the Z direction.

A memory cell array 1 according to the comparative example includes a memory columnar body 205 and a beam columnar body 209. The memory columnar body 205 includes: a core insulating film 211A (corresponding to 111A); a cap semiconductor film 231A (corresponding to 131A) disposed on the core insulating film 211A; semiconductor films 212A (corresponding to 112A) and 213A (corresponding to 113A) disposed so as to cover side surfaces of the core insulating film 211A and the cap semiconductor film 231A; and a multi-layer film 217A (corresponding to 117A). The beam columnar body 209 includes: a core insulating film 211B (corresponding to 111B); a cap semiconductor film 231B (corresponding to 131B) disposed on the core insulating film 211B; semiconductor films 212B (corresponding to 112B) and 213B (corresponding to 113B); and a multi-layer film 217B (corresponding to 117B). In other words, the beam columnar body 209 is formed by the same structure and by the same materials as the memory columnar body 205, excluding the fact that diameters of cross-sections in the X-Y directions are different. In this respect, the beam columnar body 209 can be formed along with the memory columnar body 205, in a batch, in parallel, in the same process.

However, in the beam columnar body 209 of the comparative example, contrary to in the present embodiment, the core insulating film 211B and the cap semiconductor film 231B contact each other roughly two-dimensionally in the X-Y plane, hence it is difficult for sufficient mechanical strength to be obtained. Therefore, sometimes, particularly in such cases as when density of arrangement of the beam columnar bodies 209 is low, contact portions 202a to 204a (corresponding to 102a to 104a) of conductive layers 202 to 204 (corresponding to 102 to 104), and so on, end up collapsing due to the likes of stress of inter-layer insulating layers 221 to 223 (corresponding to 121 to 123) or surface tension occurring during removal of sacrifice layers 241 to 243 (not illustrated; corresponding to 141 to 143).

In this respect, the cap semiconductor film 131B of the present embodiment shown in FIG. 5 has an anchor bolt structure in which a purposely formed void 111a of the core insulating film 111B is buried with the plug portion 131a. Therefore, bonding strength between the core insulating film 111B and the cap semiconductor film 131B is higher compared to in the comparative example. Furthermore, the plug portion 131a buried in the void 111a is formed by a material whose Young's modulus is higher than that of the material of the core insulating film 111B, hence the Young's modulus of the entire beam columnar body 109 can be further raised compared to in the structure of the comparative example not having a plug portion in the center of the core insulating film 211B. Furthermore, the above-described manufacturing steps of the embodiment make it possible for the beam columnar body 109 to be formed in a batch in parallel along with the memory columnar body 105, similarly to in the case of the comparative example. In other words, the present embodiment makes it possible to form the beam columnar body 109 of higher mechanical strength unaccompanied by an increase in processes, compared to the case of the comparative example.

Finally, several application examples of the present embodiment will be listed. Here, points of difference with the example of FIGS. 5 and 6 will mainly be described.

Figure 30:
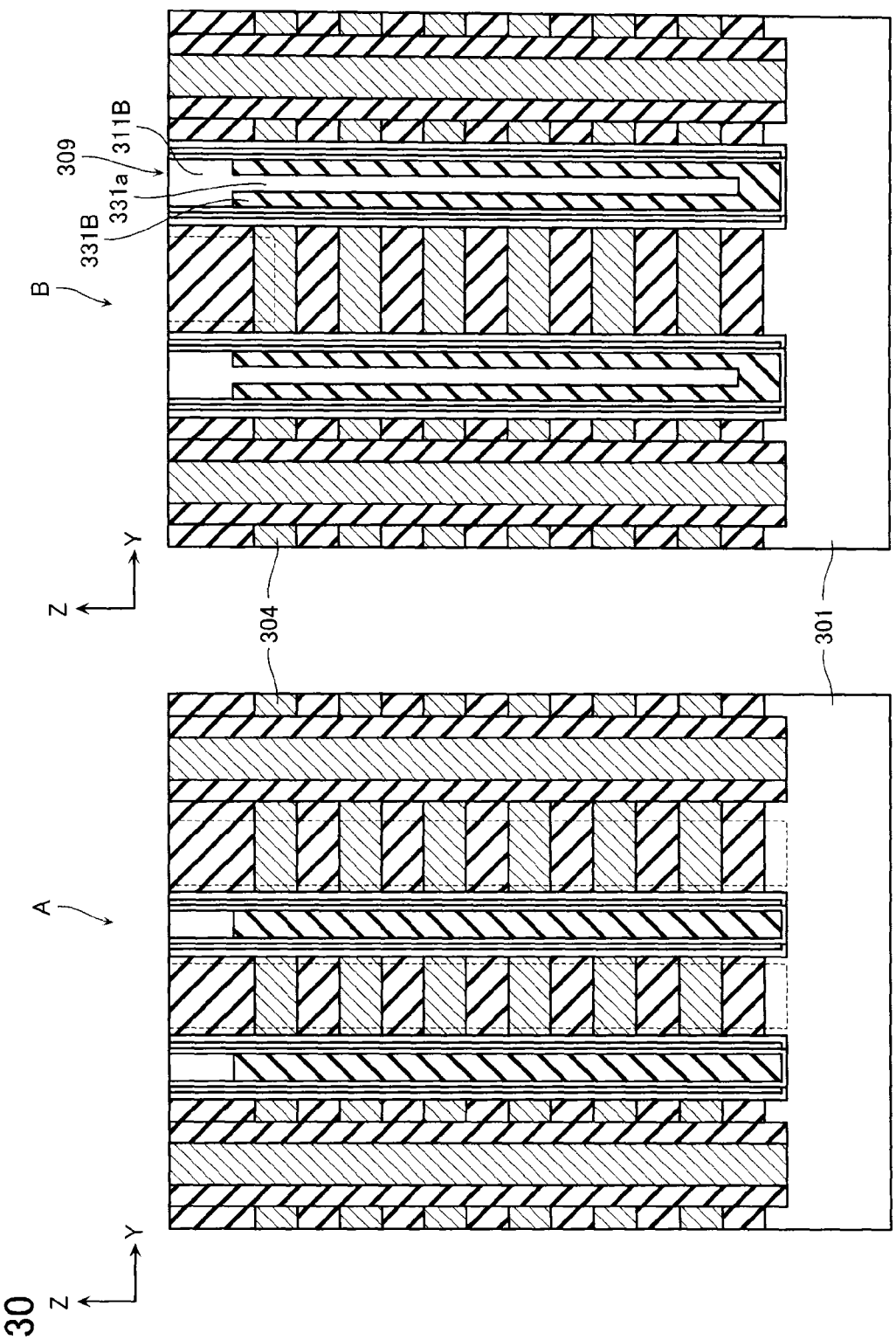
FIGS. 30 to 33 are other cross-sectional views of the memory cell array in the semiconductor memory device according to the embodiment.
Figure 31:
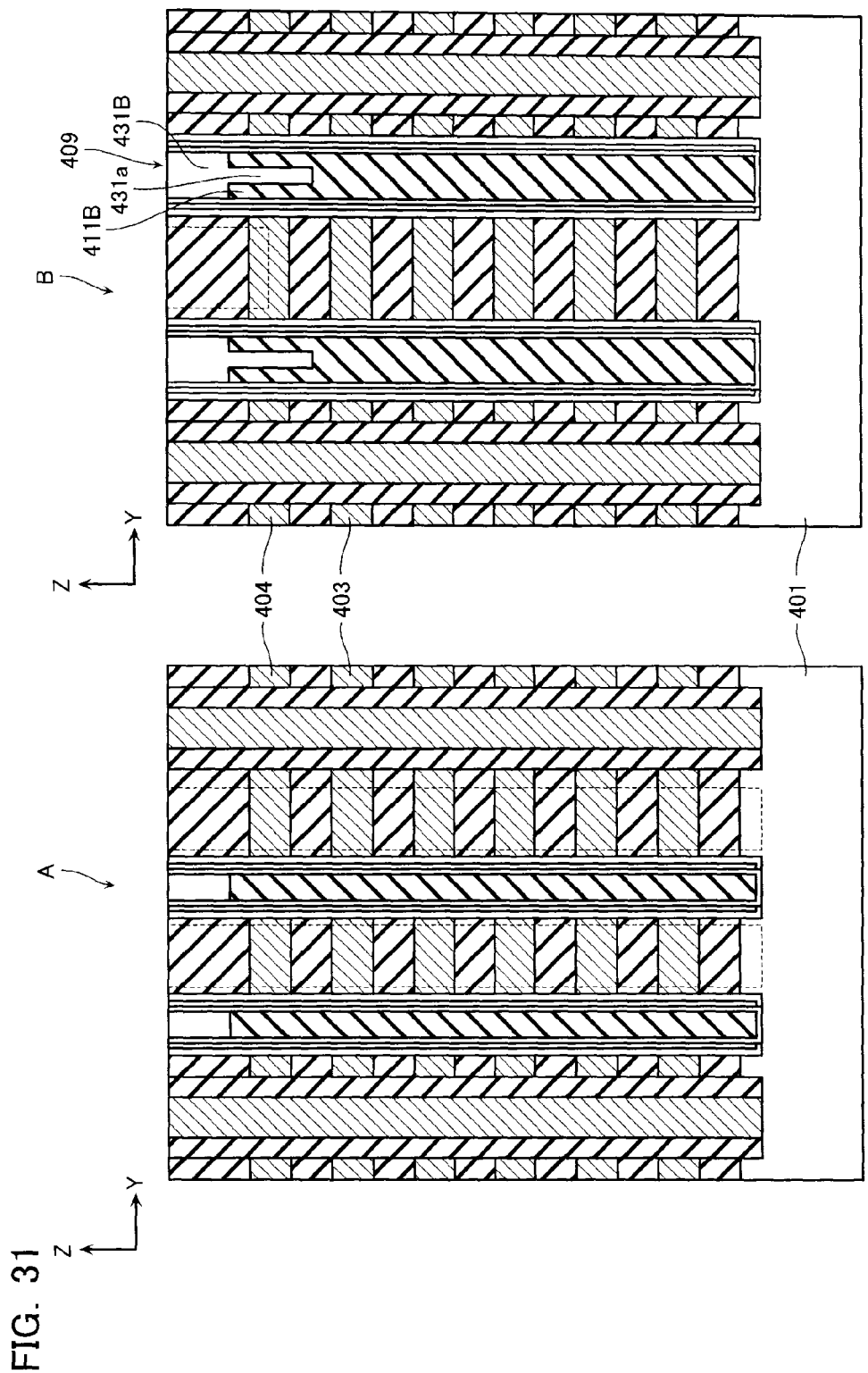
Figure 32:
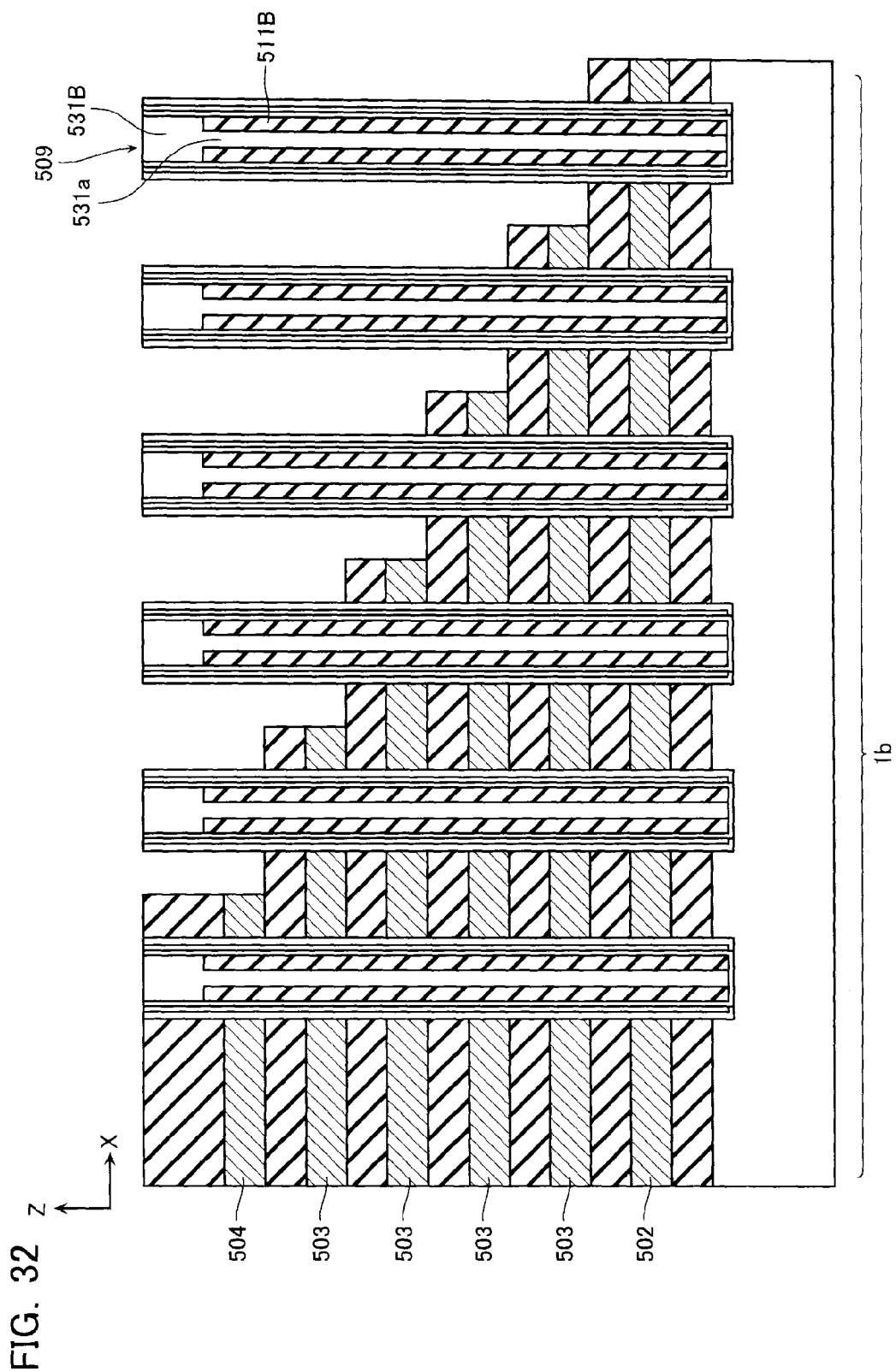
Figure 33:
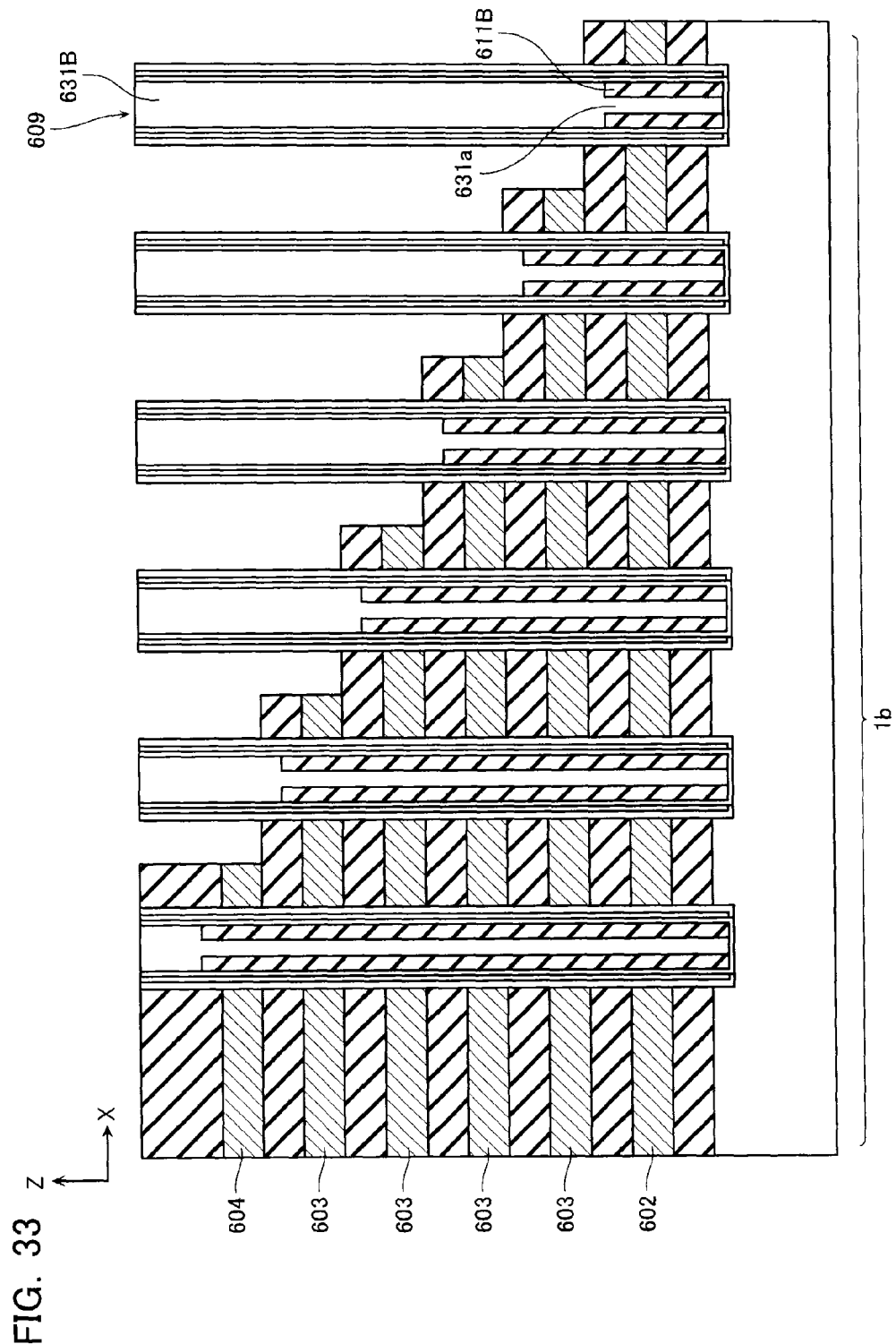

FIGS. 30 to 33 are other cross-sectional views of the memory cell array in the semiconductor memory device according to the embodiment. A in FIGS. 30 and 31 are cross-sectional views in the Y-Z directions of the memory region 1a; and B in FIGS. 30 and 31 are cross-sectional views in the Y-Z directions of the contact region 1b. Moreover, FIGS. 32 and 33 are cross-sectional views in the X-Z directions of the contact region 1b.

FIG. 30 is an example where a plug portion 331a (corresponding to 131a) of a cap semiconductor film 331B (corresponding to 131B) of a beam columnar body 309 (corresponding to 109) is formed from a position higher than an uppermost layer conductive layer 304 (corresponding to 104) to a position higher than an upper surface of a semiconductor substrate 301 (corresponding to 101).

FIG. 31 is an example where a plug portion 431a (corresponding to 131a) of a cap semiconductor film 431B (corresponding to 131B) of a beam columnar body 409 (corresponding to 109) is formed from a position higher than an uppermost layer conductive layer 404 (corresponding to 104) to a position higher than a conductive layer 403 (corresponding to 103) and lower than the conductive layer 404.

The plug portion of the cap semiconductor film does not necessarily have to be brought into contact with the base of the beam hole. Therefore, even if a lower end of the plug portion 331a or 431a does not reach to no higher than the upper surface of the semiconductor substrate 301 or 401 (corresponding to 101) as in the examples of FIGS. 30 and 31, as long as the plug portion 331a or 431a is buried to a certain extent in a central portion of a core insulating film 311B (corresponding to 111B) or 411B (corresponding to 111B), mechanical strength of the beam columnar body 309 or 409 can be increased more compared to in the comparative example.

FIG. 32 is an example where all of beam columnar bodies 509 (corresponding to 109) are formed such that an upper surface of a core insulating film 511B (corresponding to 111B) is higher than an uppermost layer conductive layer 504. Making a structure of all of the beam columnar bodies 509 the same in this way enables formation of the beam columnar body 509 to be easily performed.

In FIG. 33, a beam columnar body 609 (corresponding to 109) is formed such that an upper surface of a core insulating film 611B (corresponding to 111B) is higher than an uppermost layer conductive layer 602 to 604 (corresponding to 102 to 104) of the conductive layers 602 to 604 contacting the beam columnar body 609. If a plug portion 631a (corresponding to 131a) of a cap insulating film 631B (corresponding to 131B) is buried at least between the conductive layers 602 to 604 requiring support by the beam columnar body 609 in this way, then collapse of the beam columnar body 609 can be reduced.

As described above, the present embodiment, by having a plug portion of a cap semiconductor film of high Young's modulus formed in a central portion of a core insulating film, makes it possible to provide a semiconductor memory device having a beam columnar body of high mechanical strength and in which collapse during processes is suppressed.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a plurality of conductive layers stacked in a vertical direction on a semiconductor substrate; and
    a first columnar body and a second columnar body that extend in the vertical direction and have a side surface facing a side surface of the plurality of conductive layers,
    the first columnar body and the second columnar body each comprising:
    a first insulating film;
    a first semiconductor film disposed on the first insulating film; and
    a second semiconductor film disposed between the plurality of conductive layers and the first insulating film, and
    the first semiconductor film of the first columnar body having a lower end terminating at an upper surface of the first insulating film in the first columnar body,
    the first semiconductor film of the second columnar body having a lower end penetrating into the first insulating film to lower than the upper surface of the first insulating film in the second columnar body, and
    the second columnar body having a cross-section which is larger than that of the first columnar body at the same position in the vertical direction.

2. The semiconductor memory device according to claim 1, wherein
    the first conductive layer is a conductive layer which is highest of the plurality of conductive layers.

3. The semiconductor memory device according to claim 1, wherein
the first conductive layer is a conductive layer which is highest of the plurality of conductive layers contacting the second columnar body.

4. The semiconductor memory device according to claim 1, wherein
a lower end of the first semiconductor film of the second columnar body is positioned at or lower than an upper surface of the semiconductor substrate in the vertical direction.

5. The semiconductor memory device according to claim 1, wherein
the first insulating film adopts as a material thereof silicon oxide, and
the first semiconductor film adopts as a material thereof silicon, titanium, tungsten, nickel silicide, cobalt silicide, tungsten silicide, or silicon nitride.

6. The semiconductor memory device according to claim 1, wherein
the first insulating film of the first columnar body has an upper end positioned higher than a first position and lower than a second position and a lower end positioned lower than the first position.

7. A semiconductor memory device, comprising:
a plurality of conductive layers stacked in a vertical direction on a semiconductor substrate; and
a first columnar body and a second columnar body that extend in the vertical direction and have a side surface facing a side surface of the plurality of conductive layers,
the first columnar body and the second columnar body each comprising:
a first insulating film;
a first semiconductor film disposed on the first insulating film; and
a multi-layer film including a second semiconductor film disposed between the plurality of conductive layers and the first insulating film, and
the first semiconductor film of the first columnar body having a lower end terminating at an upper surface of the first insulating film in the first columnar body,
the first semiconductor film of the second columnar body being disposed on the multi-layer film via the first insulating film and having a lower end penetrating into the first insulating film in the second columnar body to lower than the upper surface of the first insulating film in the second columnar body, and
the second columnar body having a cross-section which is larger than that of the first columnar body at the same position in the vertical direction.

8. The semiconductor memory device according to claim 7, wherein
the first conductive layer is a conductive layer which is highest of the plurality of conductive layers.

9. The semiconductor memory device according to claim 7, wherein
the first conductive layer is a conductive layer which is highest of the plurality of conductive layers contacting the second columnar body.

10. The semiconductor memory device according to claim 7, wherein
a lower end of the first semiconductor film of the second columnar body is positioned at or lower than an upper surface of the semiconductor substrate in the vertical direction.

11. The semiconductor memory device according to claim 7, wherein
the first insulating film adopts as a material thereof silicon oxide, and
the first semiconductor film adopts as a material thereof silicon, titanium, tungsten, nickel silicide, cobalt silicide, tungsten silicide, or silicon nitride.

12. The semiconductor memory device according to claim 7, wherein
the first semiconductor film of the first columnar body contacts the multi-layer film at a second position.

13. A semiconductor memory device, comprising:
a plurality of conductive layers stacked in a vertical direction on a semiconductor substrate; and
a first columnar body and a second columnar body that extend in the vertical direction and have a side surface facing a side surface of the plurality of conductive layers,
the first columnar body and the second columnar body each comprising:
a first insulating film;
a first semiconductor film disposed on the first insulating film; and
a multi-layer film including a second semiconductor film disposed between the plurality of conductive layers and the first insulating film, and
the first semiconductor film of the first columnar body having a lower end terminating at an upper surface of the first insulating film in the first columnar body,
the first semiconductor film of the second columnar body having a lower end penetrating into the first insulating film in the second columnar body to lower than the upper surface of the first insulating film in the second columnar body, and
the second columnar body having a cross-section which is larger than that of the first columnar body at the same position in the vertical direction.

14. The semiconductor memory device according to claim 13, wherein
the first conductive layer is a conductive layer which is highest of the plurality of conductive layers.

15. The semiconductor memory device according to claim 13, wherein
the first conductive layer is a conductive layer which is highest of the plurality of conductive layers contacting the second columnar body.

16. The semiconductor memory device according to claim 13, wherein
a lower end of the first semiconductor film of the second columnar body is positioned at or lower than an upper surface of the semiconductor substrate in the vertical direction.

17. The semiconductor memory device according to claim 13, wherein
the first insulating film adopts as a material thereof silicon oxide, and
the first semiconductor film adopts as a material thereof silicon, titanium, tungsten, nickel silicide, cobalt silicide, tungsten silicide, or silicon nitride.

* * * * *